US011088060B2

(12) United States Patent
Lee et al.

(10) Patent No.: US 11,088,060 B2
(45) Date of Patent: Aug. 10, 2021

(54) PACKAGE MODULE INCLUDING A PLURALITY OF ELECTRONIC COMPONENTS AND SEMICONDUCTOR CHIP(S) EMBEDDED IN A SINGLE PACKAGE

(71) Applicant: SAMSUNG ELECTRONICS CO., LTD., Suwon-si (KR)

(72) Inventors: Jaekul Lee, Suwon-si (KR); Jinseon Park, Suwon-si (KR); Junwoo Myung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/675,877

(22) Filed: Nov. 6, 2019

(65) Prior Publication Data

US 2020/0161231 A1    May 21, 2020

(30) Foreign Application Priority Data

Nov. 20, 2018    (KR) .................. 10-2018-0143301

(51) Int. Cl.
*H01L 23/498*    (2006.01)
*H01L 23/31*    (2006.01)
(Continued)

(52) U.S. Cl.
CPC ...... *H01L 23/49827* (2013.01); *H01L 21/046* (2013.01); *H01L 23/3114* (2013.01);
(Continued)

(58) Field of Classification Search
CPC ......... H01L 23/49827; H01L 23/49861; H01L 23/3178; H01L 23/3114; H01L 23/5223; H01L 23/5227; H01L 24/05; H01L 24/45; H01L 23/49811; H01L 2224/02371; H01L 23/28; H01L 23/31; H01L 23/3107; H01L 23/3121; H01L 2224/18; H01L 2924/18162; H01L 24/20;
(Continued)

(56) References Cited

U.S. PATENT DOCUMENTS 8,208,268 B2 * 6/2012 Kajiki .................. H05K 1/144
                                                          361/761
8,263,439 B2    9/2012 Marimuthu et al.
(Continued)

*Primary Examiner* — Ermias T Woldegeorgis
(74) *Attorney, Agent, or Firm* — Sughrue Mion, PLLC

(57) ABSTRACT

A package module includes a core structure including a dummy member, one or more electronic components disposed around the dummy member, and an insulating material covering at least a portion of each of the dummy member and the electronic components, the core structure including a first penetration hole passing through the dummy member and the insulating material, a semiconductor chip disposed in the first penetration hole and having an active surface on which a connection pad is disposed and an inactive surface, an encapsulant covering at least a portion of each of the core structure and the semiconductor chip and filling at least a portion of the first penetration hole, and a connection structure disposed on the core structure and the active surface and including a redistribution layer electrically connected to the electronic components and the connection pad.

18 Claims, 16 Drawing Sheets

(51) Int. Cl.
  *H01L 23/522* (2006.01)
  *H01L 23/00* (2006.01)
  *H01L 21/04* (2006.01)
  *H01L 29/66* (2006.01)
  *H01L 29/78* (2006.01)
  *H01L 29/16* (2006.01)

(52) U.S. Cl.
  CPC .... *H01L 23/3178* (2013.01); *H01L 23/49811* (2013.01); *H01L 23/49861* (2013.01); *H01L 23/5223* (2013.01); *H01L 23/5227* (2013.01); *H01L 24/05* (2013.01); *H01L 24/45* (2013.01); *H01L 29/1608* (2013.01); *H01L 29/66068* (2013.01); *H01L 29/7802* (2013.01); *H01L 2224/02371* (2013.01)

(58) Field of Classification Search
  CPC ....... H01L 2224/12105; H01L 23/3128; H01L 21/56; H01L 23/145; H01L 23/13; H01L 23/49822; H01L 23/5389; H01L 23/49816; H01L 25/16; H01L 25/165
  See application file for complete search history.

(56) References Cited

U.S. PATENT DOCUMENTS

| | | | |
|---|---|---|---|
| 9,991,219 B2 * | 6/2018 | Seol | H01L 24/25 |
| 10,026,678 B1 * | 7/2018 | Cho | H01L 24/20 |
| 2018/0247891 A1 | 8/2018 | Chiu et al. | |

* cited by examiner

I-I'

PACKAGE MODULE INCLUDING A PLURALITY OF ELECTRONIC COMPONENTS AND SEMICONDUCTOR CHIP(S) EMBEDDED IN A SINGLE PACKAGE

CROSS-REFERENCE TO RELATED APPLICATION(S)

This application claims the benefit of priority to Korean Patent Application No. 10-2018-0143301 filed on Nov. 20, 2018 in the Korean Intellectual Property Office, the entire disclosure of which is incorporated herein by reference.

TECHNICAL FIELD

The present disclosure relates to a package module in which a plurality of electronic components and semiconductor chips are embedded in a single package.

BACKGROUND

To cope with market demand for the thinning, multifunctionalization and implementation of high performance in smartphones, it is necessary for semiconductor chips and semiconductor packages to be lightweight, thinned and shortened, while having fine circuit widths, high density and the like. To this end, the fabrication technology of semiconductor packages is rapidly developing. For example, a chip scale package (CSP) has been developed in accordance with such market demand, and semiconductor package related technologies, such as package on package (POP), through silicon via (TSV), fan-out wafer level package (FO-WLP) and or the like, are being developed. Of these, the FO-WLP technology has the advantage of increasing integration density of connections between semiconductor chips and a substrate and of improving thermal and electrical characteristics, while using an existing semiconductor process as is.

On the other hand, the number of I/Os of semiconductor chips has been greatly increased to cope with the multifunctionalization and high performance of smartphones, and the technologies in which a large number of semiconductor chips and/or passive components may be mounted to perform a plurality of functions in one package are being developed. However, since FO-WLP may package only one semiconductor chip, there is a limit to meeting market demand that requires packaging of a large number of semiconductor chips.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a package module in which thinning and miniaturization may be implemented, even when a large number of chips and electronic components are included, the degree of integration may be increased, and a problem such as undulation or resin bleeding may be prevented.

According to an aspect of the present disclosure, a semiconductor chip is mounted and packaged together with one or more electronic components in a package to be modularized. In this case, the semiconductor chip is disposed to be embedded in a penetration hole penetrating through a dummy member.

According to an aspect of the present disclosure, a package module includes a core structure including a dummy member, one or more electronic components disposed around the dummy member, and an insulating material covering at least a portion of each of the dummy member and the one or more electronic components, the core structure including a first penetration hole passing through the dummy member and the insulating material, a semiconductor chip disposed in the first penetration hole and having an active surface on which a connection pad is disposed and an inactive surface opposing the active surface, an encapsulant covering at least a portion of each of the core structure and the semiconductor chip, the encapsulant being disposed in at least a portion of the first penetration hole, and a connection structure disposed on the core structure and the active surface of the semiconductor chip and including a redistribution layer electrically connected to the one or more electronic components and the connection pad.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
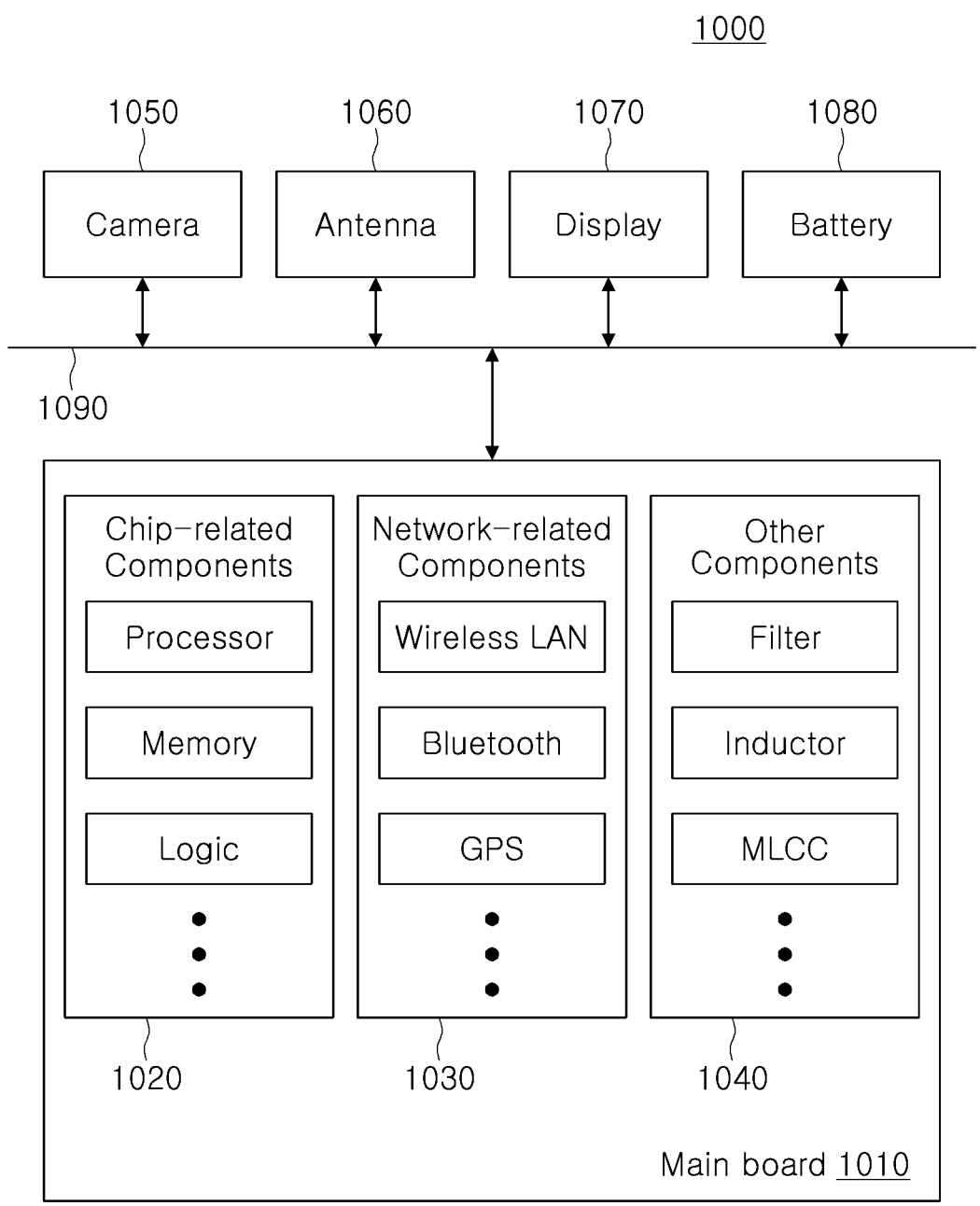
FIG. 1 is a schematic block diagram illustrating an example of an electronic device system.

Hereinafter, examples of the present disclosure will be described with reference to the accompanying drawings.

The shape and size of constituent elements in the drawings may be exaggerated or reduced for clarity.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
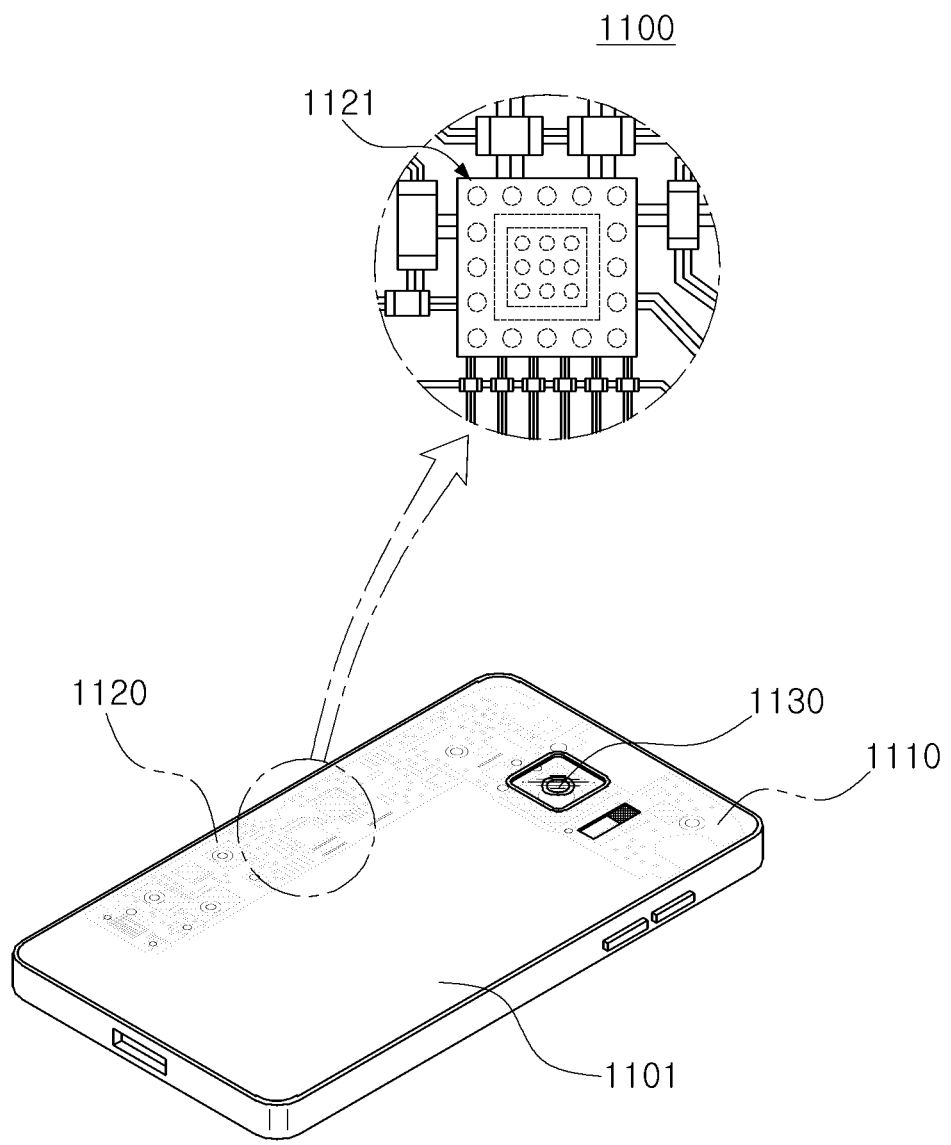
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

In this case, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
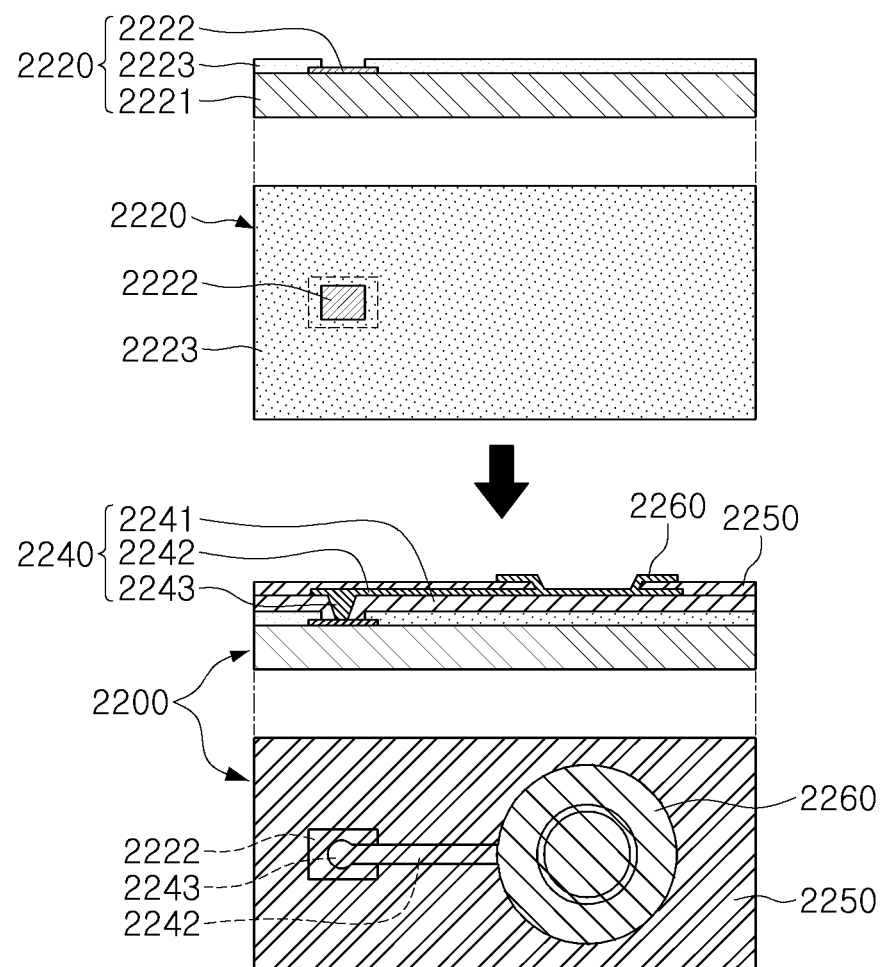
FIGS. 3A and 3B are schematic cross-sectional views illustrating states of a fan-in semiconductor package before and after being packaged.
Figure 3B:
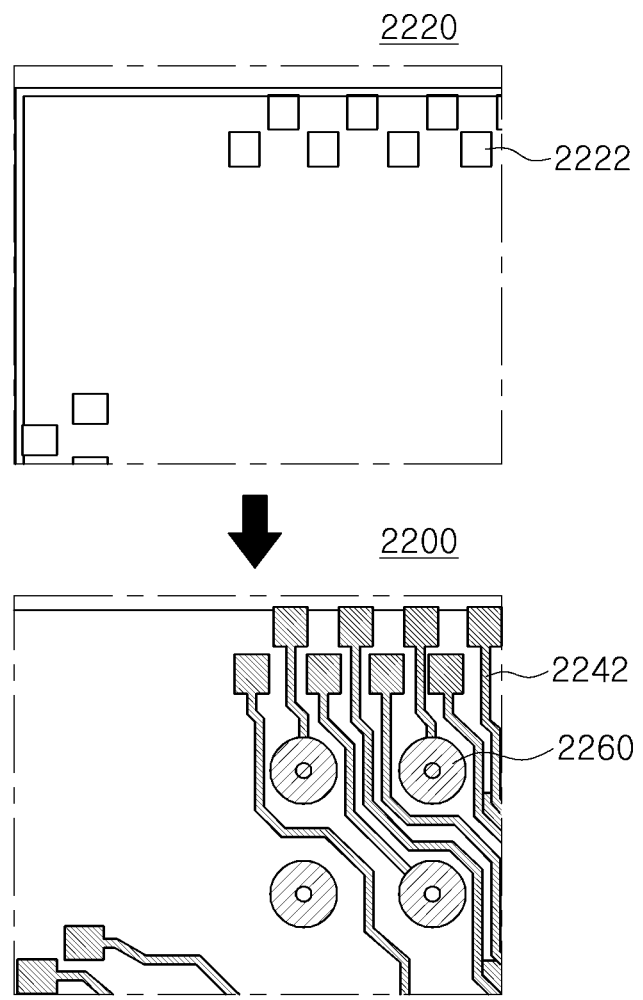

FIGS. 3A and 3B are schematic cross-sectional views illustrating states of a fan-in semiconductor package before and after being packaged.

Figure 4:
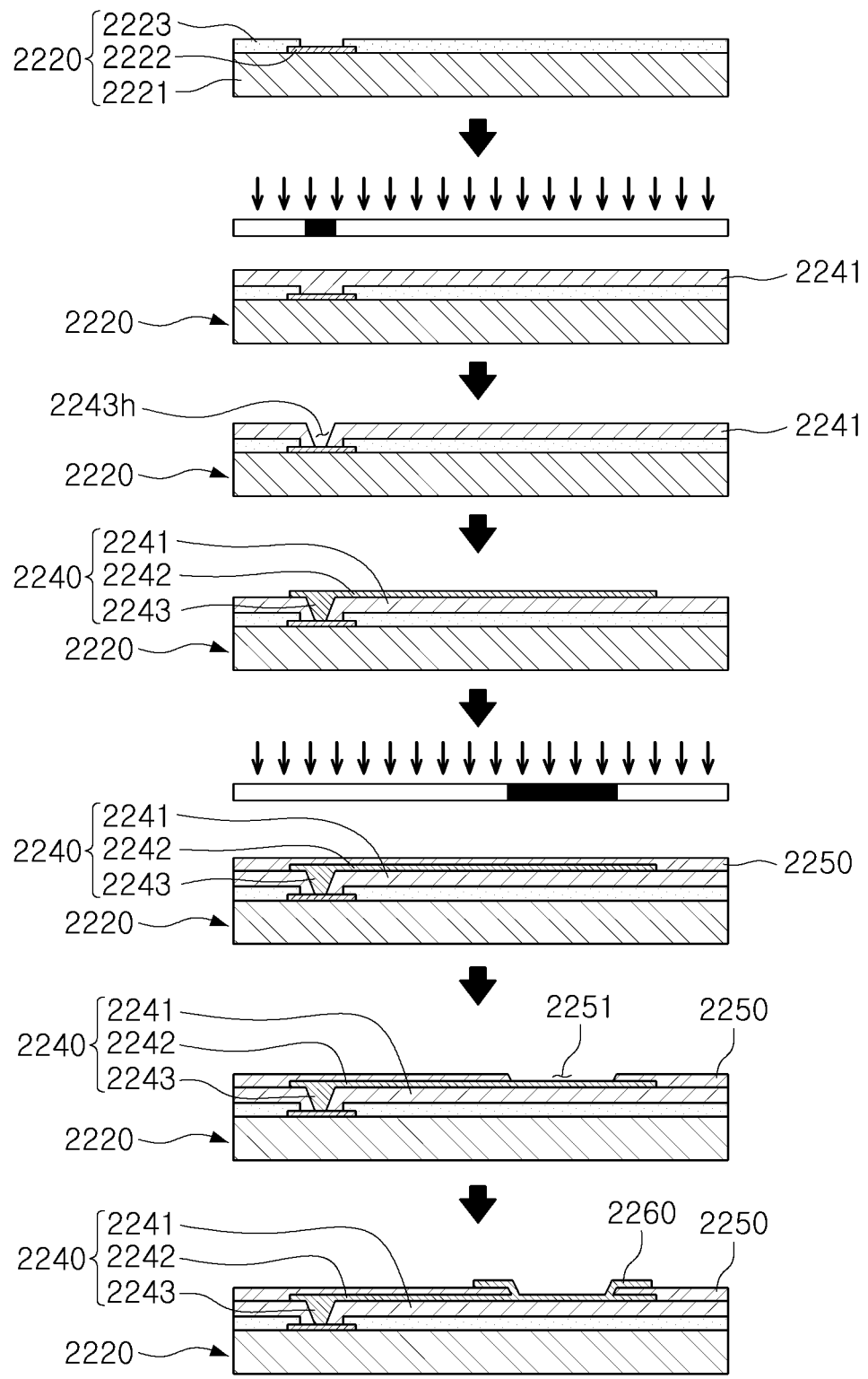
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 to redistribute the connection pads 2222. The connection member 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. For example, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
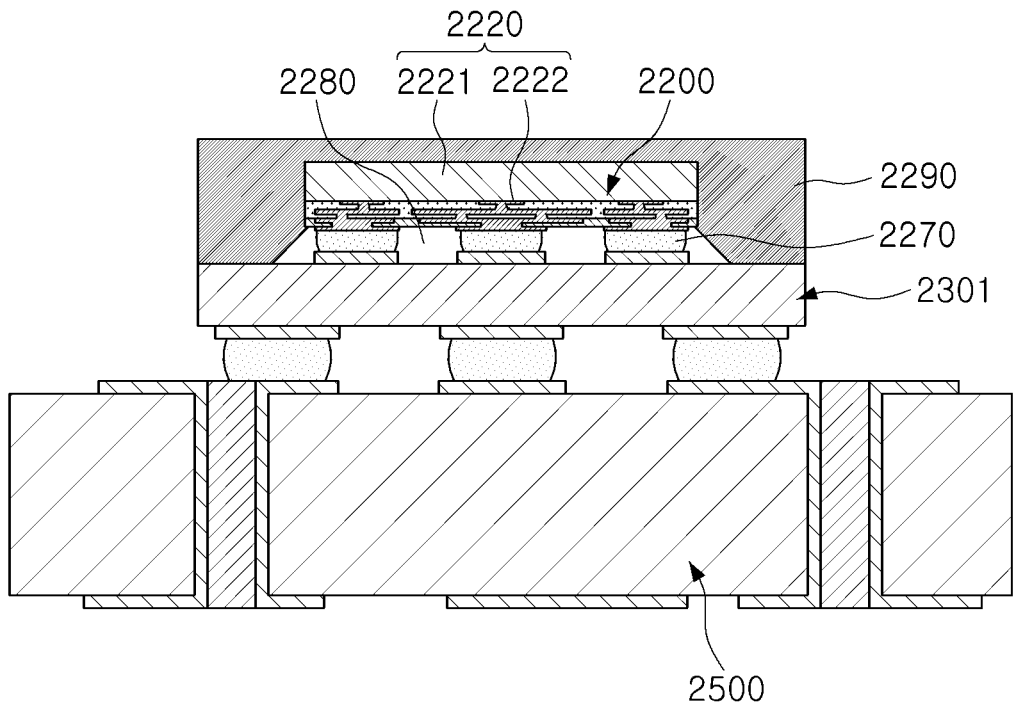
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a printed circuit board (PCB) substrate and is ultimately mounted on a mainboard of an electronic device.

Figure 6:
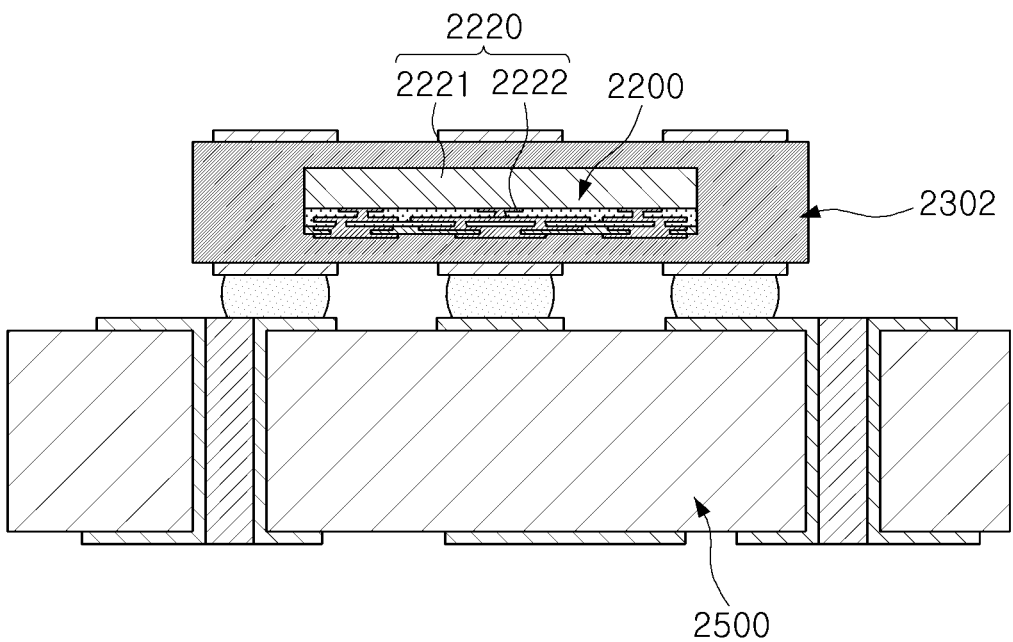
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board (PCB) and is ultimately mounted on a mainboard of an electronic device.

Referring to FIGS. 5 and 6, in a fan-in semiconductor package 2200, connection pads 2222, For example, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the PCB 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate PCB 2302, connection pads 2222, For example, I/O terminals, of the semiconductor chip 2220 may be redistributed by the PCB 2302 in a state in which the fan-in semiconductor package 2200 is embedded in the PCB 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate PCB and be then mounted on the mainboard of the electronic device through a packaging process or may be mounted and used on the mainboard of the electronic device in a state in which it is embedded in the PCB.

Fan-Out Semiconductor Package

Figure 7:
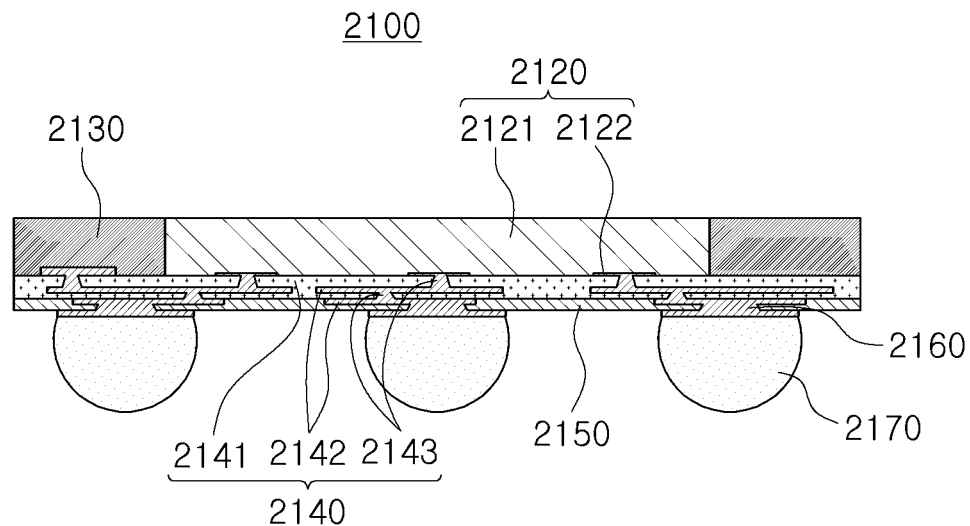
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate PCB, as described below.

Figure 8:
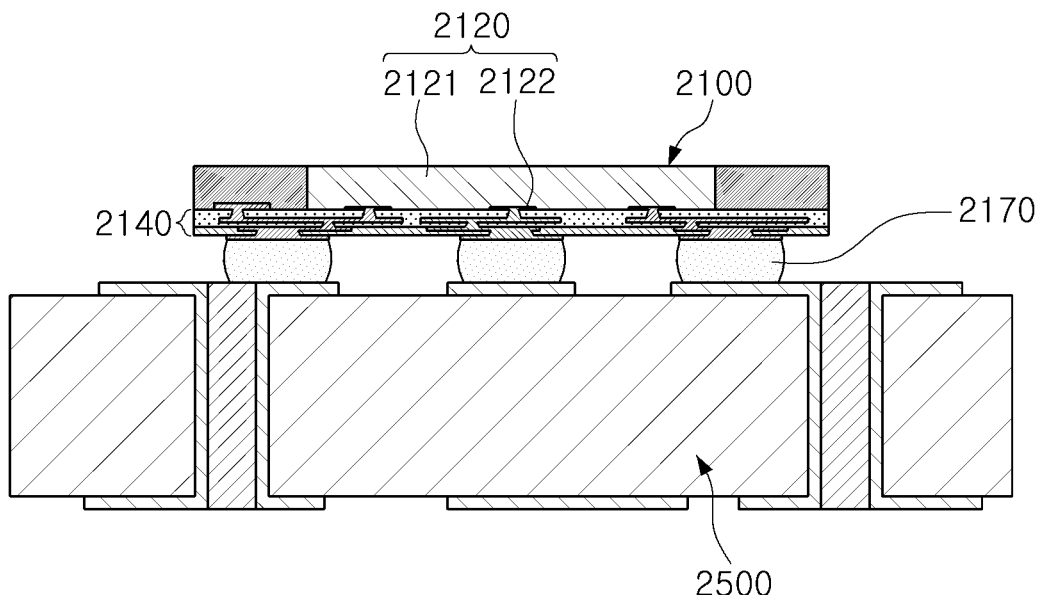
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. For example, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate PCB, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a PCB, or the like, having a scale, a purpose, and the like, different from those of the fan-out semiconductor package, and having the fan-in semiconductor package embedded therein.

Hereinafter, a package module, in which thinning and miniaturization may be implemented even when a large number of chips and components are included, the degree of integration may be increased, and a problem such as undulation or resin bleeding may be prevented, will be described with reference to the accompanying drawings.

Package Module

Figure 9:
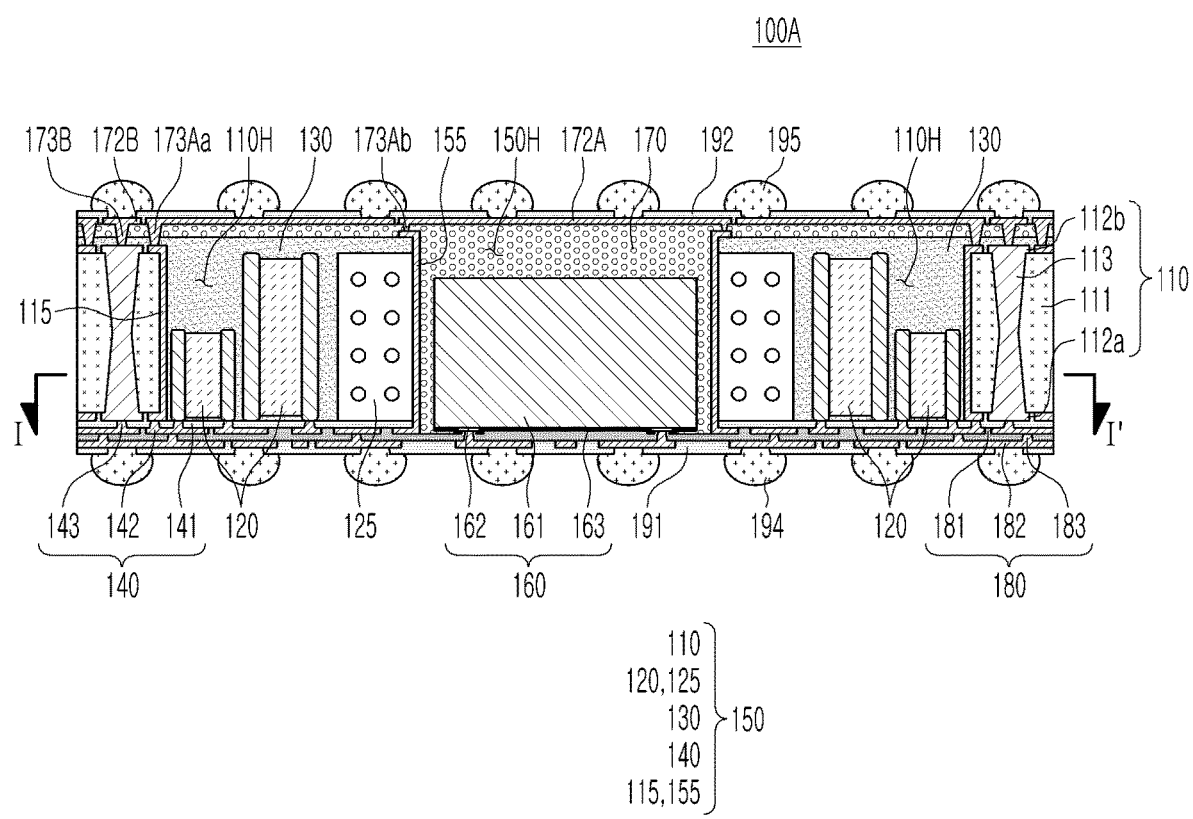
FIG. 9 is a cross-sectional view schematically illustrating an example of a package module.

FIG. 9 is a cross-sectional view schematically illustrating an example of a package module.

Figure 10:
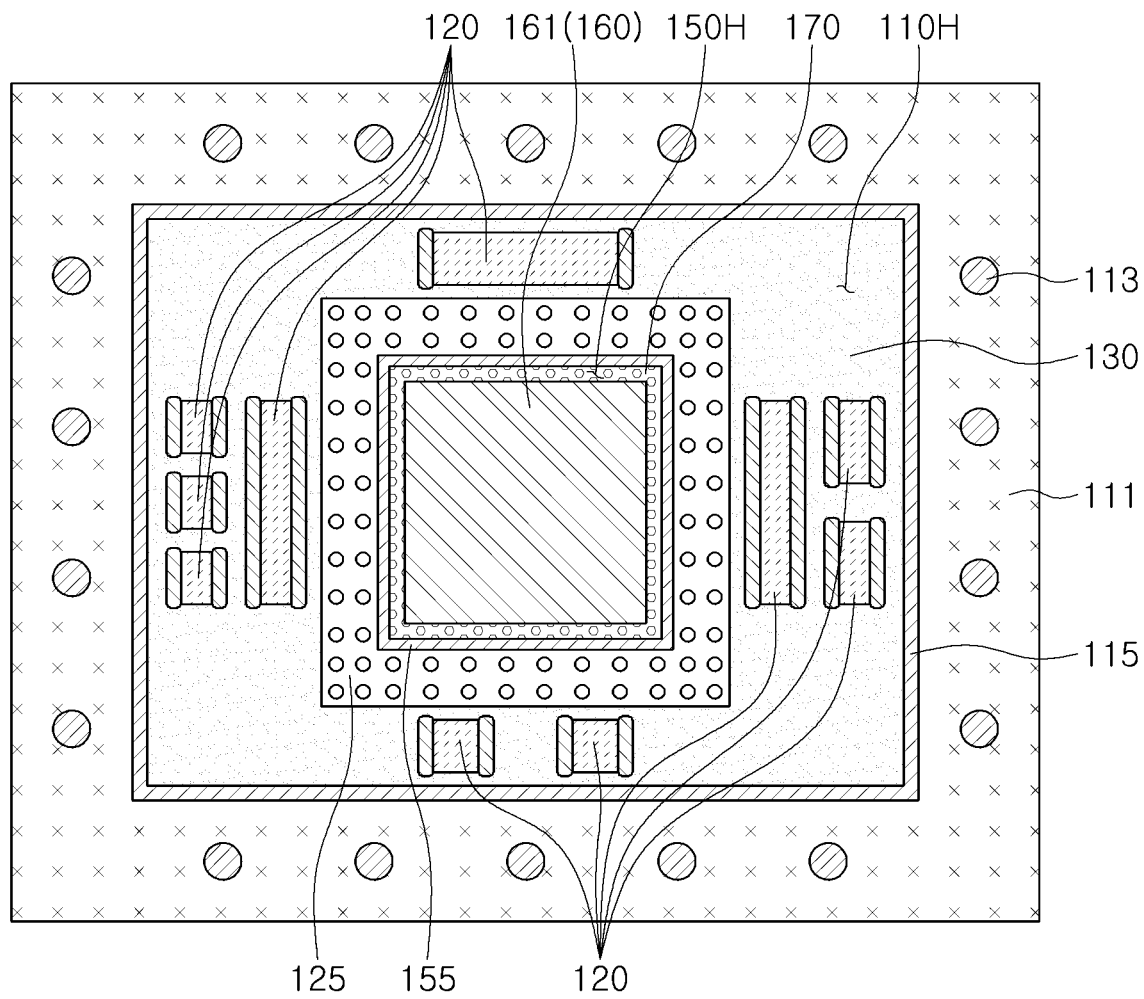
FIG. 10 is a schematic cutaway plan view of the package module, taken along line I-I' of FIG. 9.

FIG. 10 is a schematic cross-sectional top view of the package module, taken along line I-I' of FIG. 9.

Referring to the drawings, a package module 100A according to an example includes a core structure 150 including a dummy member 125, one or more electronic components 120 disposed around the dummy member 125, and an insulating material 130 covering at least a portion of each of the dummy member 125 and the one or more electronic components 120, the core structure 150 including a first penetration hole 150H at least penetrating through the dummy member 125 and the insulating material 130; a semiconductor chip 160 disposed in the first penetration hole 150H, and having an active surface on which a connection pad 162 is disposed and an inactive surface opposing the active surface; an encapsulant 170 covering at least a portion of each of the core structure 150 and the semiconductor chip 160, and filling at least a portion of the first penetration hole 150H; and a connection structure 180 disposed on the core structure 150 and the active surface of the semiconductor chip 160, and including a redistribution layer 182 electrically connected to the connection pad 162.

As described above, in the case of the package module 100A according to an example, one or more electronic components 120 are embedded in the core structure 150, and separately therefrom, the semiconductor chip 160 is disposed in the first penetration hole 150H penetrating through the core structure 150. Thus, as respective blocks are formed to distinguish between different types of components, a compact design is implemented. Therefore, thinning and miniaturization may be obtained even in a case in which a relatively large number of chips and components are included. In detail, since one or more electronic components 120 and the semiconductor chip 160 are disposed in a single package to be modularized, an interval between the chip and the components may be significantly reduced, and thus, a mounting area on a printed circuit board such as a mainboard may be significantly reduced. In addition, since an electrical path between the semiconductor chip 160 and the one or more electronic components 120 may be significantly reduced, a noise problem may be reduced. In addition, the one or more electronic components 120 are first encapsulated using the insulating material 130, and then, the semiconductor chip 160 is encapsulated with the encapsulant 170. As described above, since the sealing processes 130 and 170 of two or more steps are performed, thereby significantly reducing a yield-related problem of the semiconductor chip 160 due to poor mounting of the electronic components 120, and reducing an influence of foreign matter on the semiconductor chip 160 by the electronic components 120.

Figure 17:
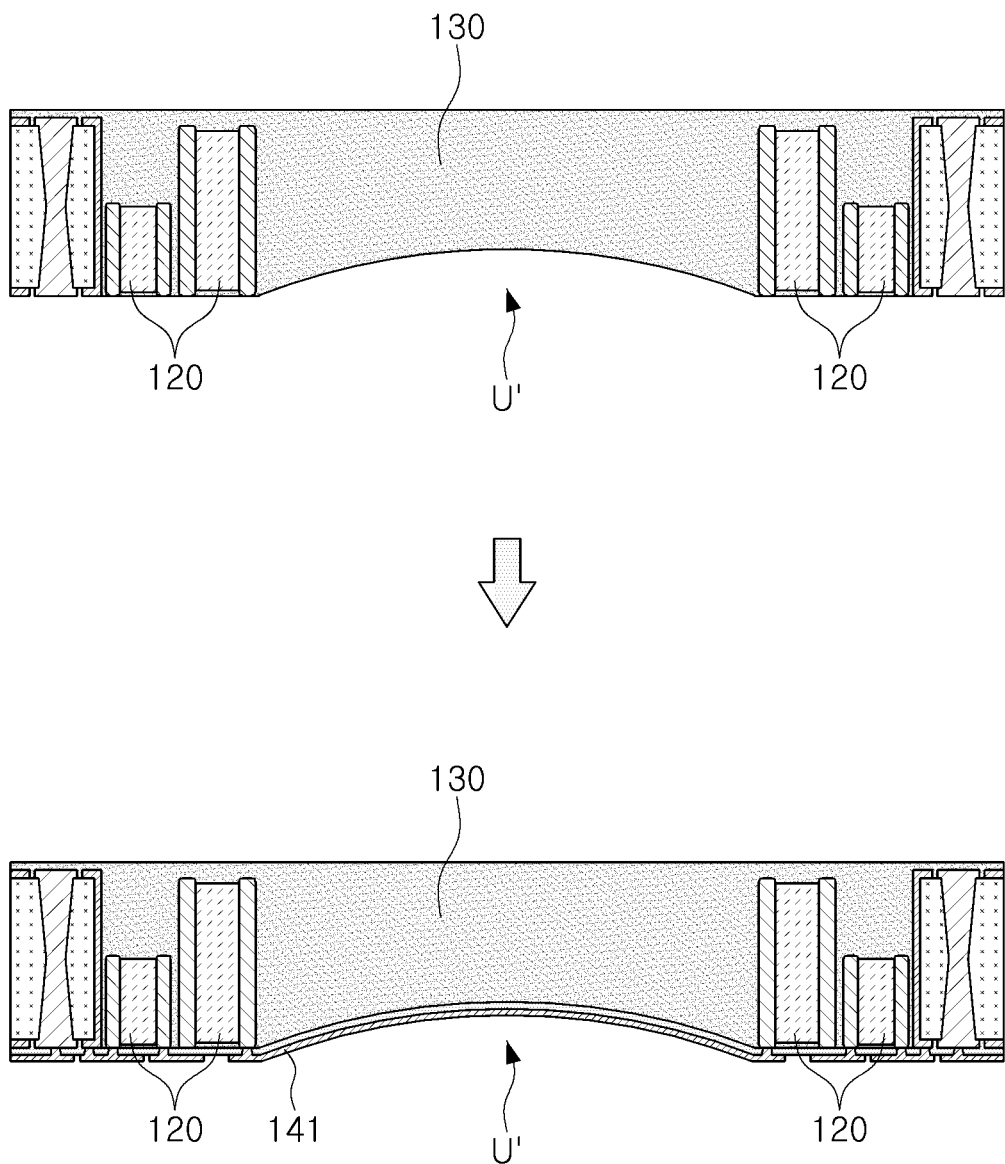
FIGS. 17 and 18 schematically illustrate a problem such as undulation and a resin flow which may occur in a case in which a dummy member is omitted.
Figure 18:
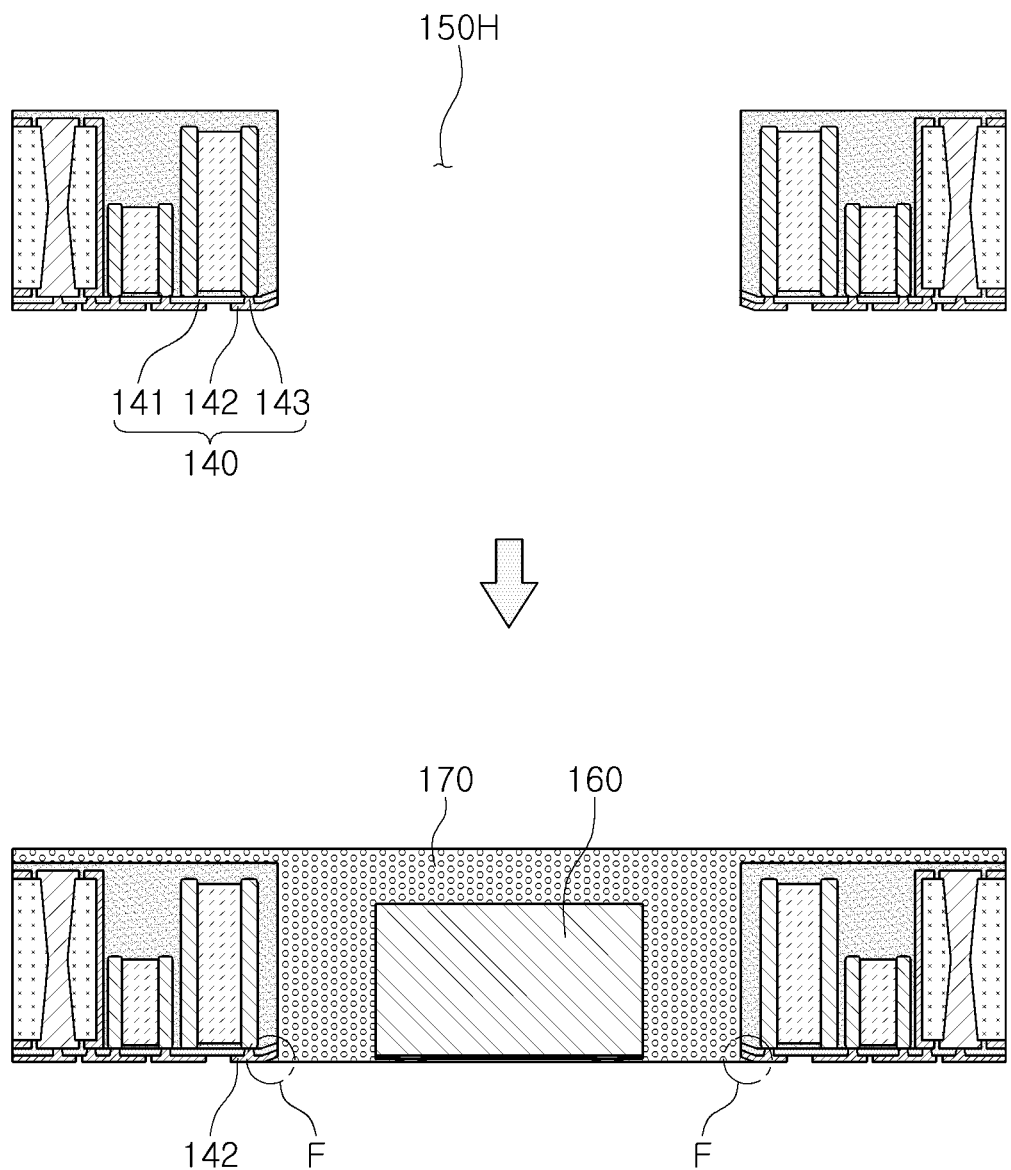

On the other hand, in the case in which one or more electronic components 120 and the semiconductor chip 160 are sealed while passing through two or more sealing processes 130 and 170 as in the case of the package module 100A according to an example, undulation may occur in the insulating material 130. In this case, in the process of disposing and encapsulating the semiconductor chip 160 with the encapsulant 170, a resin-flow related problem in which a material for formation of the encapsulant 170 flows into a space formed by undulation may occur. For example, as illustrated in FIG. 17, since there is a thickness difference between an area in which the one or more electronic components 120 are disposed and an area in which the one or more electronic components 120 is not disposed, undulation U' may occur in the area in which the one or more electronic components 120 are not disposed, in the sealing process using the insulating material 130. In this case, for example, when an insulating layer 141 is formed to further form a wiring member 140 as required, it may be difficult to obtain a flat surface due to the undulation U', such that plating defects may occur in a process of forming a wiring layer 142 and wiring vias 143. Further, as illustrated in FIG. 18, in the process of disposing the semiconductor chip 160 and performing encapsulation using the encapsulant 170 after formation of the first penetration hole 150H, a resin flow in which a material of the encapsulant 170 flows toward the wiring layer 142 may occur, and in this case, the wiring layer 142 may be contaminated by the resin.

Figure 12:
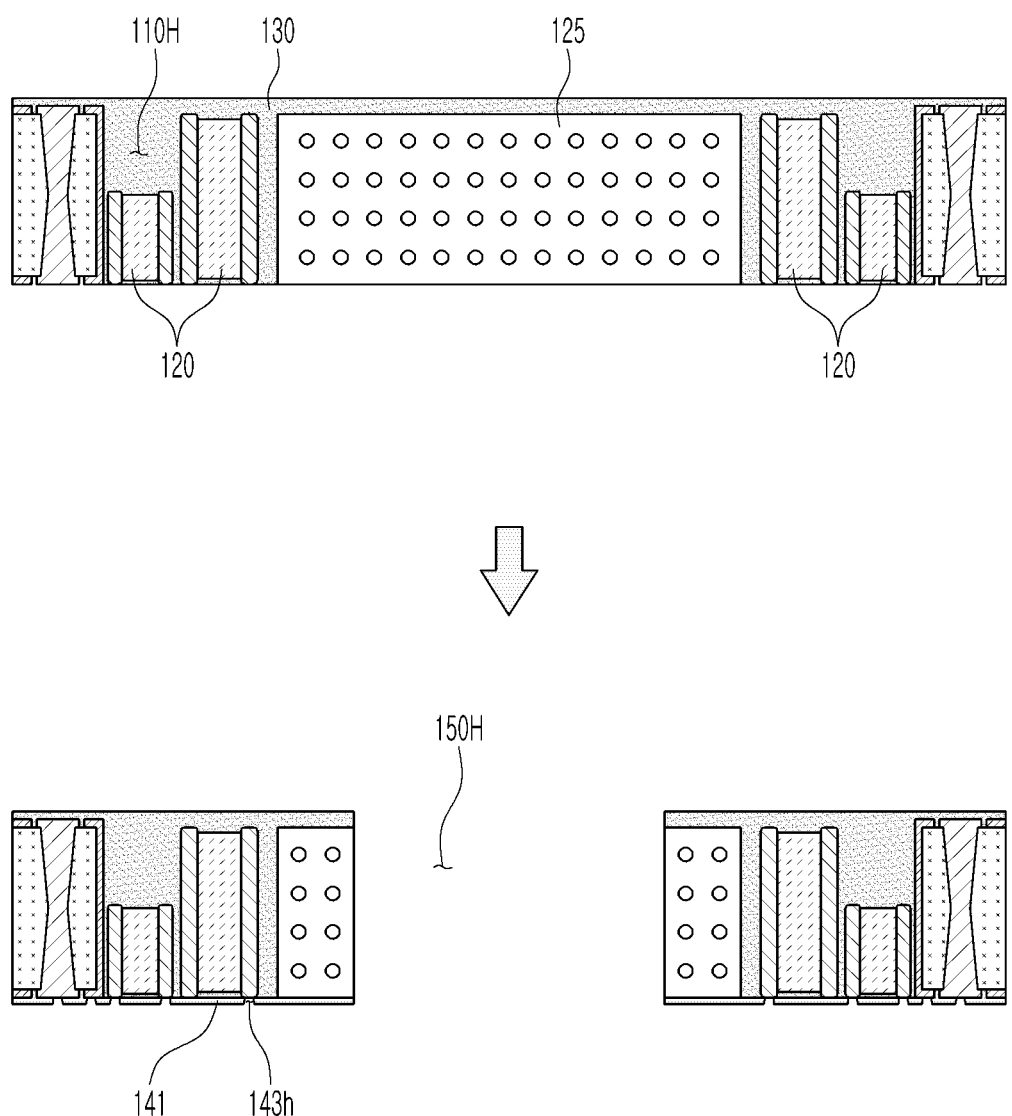
Figure 13:
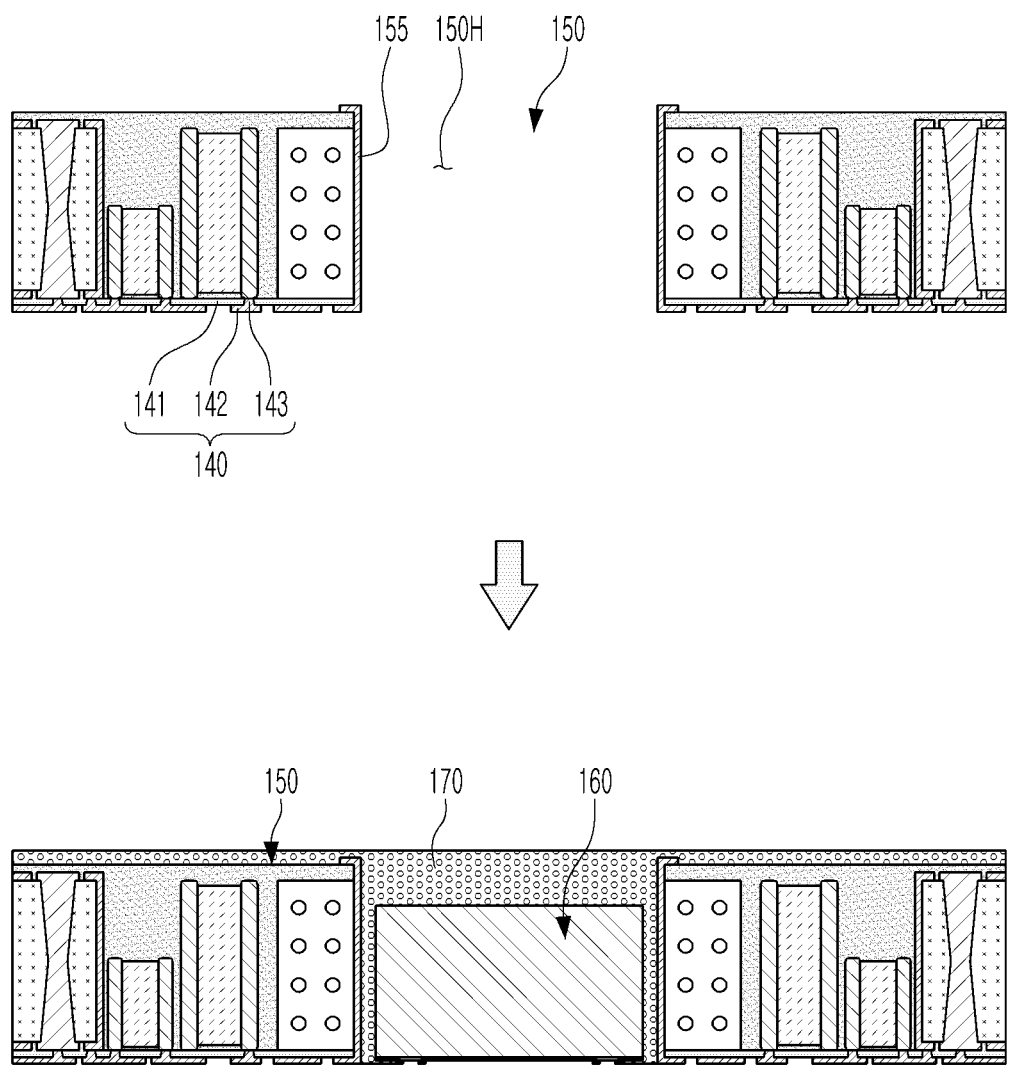

As illustrated in FIG. 12, in the case of the package module 100A according to an example, the dummy member 125 is disposed in the area in which one or more electronic components 120 are not disposed in the core structure 150, to then be sealed with the insulating material 130, thereby preventing occurrence of undulation. Thus, as illustrated in FIG. 13, the wiring member 140 may be formed on a flat surface when the wiring member 140 is formed as required. As a result, a plating defect of the wiring layer 142 and the wiring via 143 may be prevented. The first penetration hole 150H is formed to penetrate through the dummy member 125, and the semiconductor chip 160 is disposed on the first penetration hole 150H. In this case, since an inner side surface of the dummy member 125 constitutes a portion of an inner side surface of the first penetration hole 150H, the inner side surface of the dummy member 125 continuously surrounds a side surface of the semiconductor chip 160. Also, as illustrated in FIG. 13, since no undulation occurs, a resin flow of a material forming the encapsulant 170 may be prevented when performing encapsulation using the encapsulant 170. As described above, the dummy member 125 is previously introduced into a region in which the semiconductor chip 160 is to be disposed, and the semiconductor chip 160 is disposed and embedded in the first penetration hole 150H, penetrating through the dummy member 125, thereby preventing occurrence of undulation of the above-described insulating material 130, and as a result, preventing a resin flow to the wiring layer 142 and the like of the encapsulant 170, to be described later.

The core structure 150 may further include a frame 110, the frame 110 having a second penetration hole 110H and including a plurality of conductor pattern layers 112a and 112b electrically connected to each other. In this case, the dummy member 125 and the one or more electronic components 120 may be disposed parallel to each other in the second penetration hole 110H, the insulating material 130 covers at least a portion of the frame 110 and fills at least a portion of the second penetration hole 110H, and the first penetration hole 150H may be located inside the second penetration hole 110H. As the frame 110 includes a plurality of the conductor pattern layers 112a and 112b, the number of layers of the redistribution layer 182 of the connection structure 180 may be reduced. In addition, the frame 110 includes a conductor via 113 for electrically connecting the conductor pattern layers 112a and 112b, and thus, may also function as an electrical connection member for electrical connection in a vertical direction. In addition, the rigidity of the package module 100A may be further improved depending on a detailed material of an insulating layer 111, and uniformity of a thickness of the insulating material 130 may be secured.

The core structure 150 may include the wiring member 140 that includes the wiring layer 142 that may first redistribute one or more of the electronic components 120, and thereafter, the first penetration hole 150H penetrating through the wiring member 140 may be formed to receive the semiconductor chip 160 therein. As described above, when the wiring member 140 is separately first introduced into the core structure 150, a material of the insulating layer 141 of the wiring member 140 may be selected regardless of the semiconductor chip 160. For example, a non-photoimageable dielectric material such as an Ajinomoto Build-up Film (ABF) including an inorganic filler, other than a photoimageable dielectric (PID) material, may be used as a material of the insulating layer 141. Since such a film type of non-photoimageable dielectric material has excellent flatness, a problem of undulation and cracking caused by protruding electrodes of the electronic component 120 may be reduced. In addition, in the case of the non-photoimageable dielectric material, since an opening is formed by a laser via process, even in a case in which a material of the insulating material 130 bleeds into an electrode of the electronic component 120, the electrode may be effectively exposed by a via formed by the laser. Therefore, occurrence of a problem caused by electrode exposure failure may be prevented. In addition, the wiring member 140 may be formed before the semiconductor chip 160 is disposed, and thus, has an advantage in that a yield of the semiconductor chip 160 may not be affected. In this case, a photoimageable dielectric (PID) material may be used as a material of an insulating layer 181 of the connection structure 180. In this case, since a fine pitch may be implemented through a photo via process, tens to millions of connection pads 162 of the semiconductor chip 160 may be effectively redistributed, as in the normal case. For example, a material of the insulating layer 141 on which the wiring layer 142 and the wiring vias 143 are formed, a material of the insulating layer 181 on which the redistribution layer 182 and the connection via 183 are formed may be selectively controlled, thereby exhibiting an excellent synergy effect.

The wiring member 140 may first be introduced into the core structure 150 separately, before forming the first penetration hole 150H in which the semiconductor chip 160 is disposed, and thus, a bottom surface of the second penetration hole 110H may have a step with respect to a bottom surface of the first penetration hole 150H. As a result, a surface of the one or more electronic components 120 in contact with the wiring member 140 is coplanar with a surface of the dummy member 125 in contact with the wiring member 140, but may have a step with respect to the active surface of the semiconductor chip 160. For example, the active surface of the semiconductor chip 160 may be located on a lower level than a surface of each of the one or more electronic components 120 and the dummy member 125, in contact with the wiring member 140, with respect to the inactive surface of the semiconductor chip 160. For example, by first introducing the wiring member 140 to the core structure 150 separately before forming the first penetration hole 150H in which the semiconductor chip 160 is disposed, a structural characteristic different from that of a package module structure of the related art may be provided.

On the other hand, first and second metal layers 115 and 155 may be disposed on inner side surfaces of the second penetration hole 110H and the first penetration hole 150H, respectively. In this case, mutual interference of electromagnetic waves between different types of blocks may be effectively blocked, and a heat radiation effect may also be improved. The first and second metal layers 115 and 155 may extend from at least one surface of the frame 110 and the insulating material 130, respectively. A backside metal layer 172A may be disposed on an opposite side of aside of the encapsulant 170 in which the connection structure 180 is disposed, and may be connected to the first metal layer 115 through first metal vias 173Aa penetrating through the encapsulant 170 and the insulating material 130. Thus, electromagnetic interference between different types of blocks may be more easily blocked, and an excellent heat radiation effect may be provided. In this case, the first metal via 173Aa may be disposed to be higher than the second metal via 173Ab, and the first metal via 173Aa and the second metal via 173Ab may have a relationship of multi-step vias therebetween.

A backside conductor pattern layer 172B may be further disposed on an opposite side of a side of the encapsulant 170 in which the connection structure 180 is disposed, and may be electrically connected to the plurality of conductor pattern layers 112a and 112b, through backside conductor vias 173B passing through the encapsulant 170 and the insulating material 130. With the introduction of the backside conductor pattern layer 172B, the application of the package module 100A to a POP structure may be facilitated. The term 'backside' used herein is determined based on the semiconductor chip 160, and for example, refers to a direction of the inactive surface side, which will be applied similarly below.

On the other hand, a first passivation layer 191 may be further disposed on the connection structure 180, and a second passivation layer 192 may be further disposed on the core structure. Further, a plurality of first electrical connection metals 194, electrically connected to a plurality of under bump metals (not illustrated) respectively, may be disposed on the first passivation layer 191. A plurality of second electrical connection metals 195, electrically connected to the backside metal layer 172A and/or the backside conductor pattern layer 172B, respectively, may be disposed on the second passivation layer 192.

Hereinafter, the components of the package module 100A according to an example will be described in detail with reference to the drawings.

As the frame 110 includes the plurality of conductor pattern layers 112a and 112b, the number of layers of the redistribution layer 182 of the connection structure 180 may be reduced. In addition, the frame 110 includes a conductor via 113, electrically connecting the conductor pattern layers 112a and 112b, and thus, may also function as an electrical connection member for electrical connection in a vertical direction. In this case, rigidity of the package module 100A may be further improved depending on a detailed material of the insulating layer 111 provided as required, and thickness uniformity of the insulating material 130 may be secured. The frame 110 includes the second penetration holes 110H spaced apart from each other by a predetermined distance. In each of the second penetration holes 110H, one or more electronic components 120 and the dummy member 125 are disposed to be spaced apart from an inner side surface of the second penetration hole 110H by a predetermined distance. The second penetration hole 110H may be formed to have a form completely penetrating through the frame 110, and the inner side surface of the second penetration hole 110H may be continuously formed to surround the one or more electronic components 120 and the dummy member 125, which is merely provided by way of an example, and the shape of the frame 110 and the second penetration hole 110H may be variously modified to have different forms.

The frame 110 includes the insulating layer 111, the first conductor pattern layer 112a disposed on a lower surface of the insulating layer 111, the second conductor pattern layer 112b disposed on an upper surface of the insulating layer 111, and the conductor via 113 passing through the insulating layer 111 and connecting the first and second conductor pattern layers 112a and 112b. The first and second conductor pattern layers 112a and 112b of the frame 110 may have a thickness greater than that of the redistribution layer 182 of the connection structure 180. The first and second conductor pattern layers 112a and 112b of the frame 110 may be formed to have a relatively larger size through a substrate process in accordance with the scale of the one or more electronic components 120. On the other hand, the redistribution layer 182 of the connection structure 180 may be formed to have a relatively smaller size for a fine design and a high density design.

A material of the insulating layer 111 is not particularly limited. For example, an insulating material may be used. As the insulating material, a thermosetting resin such as an epoxy resin, or a resin formed by impregnating these resins in a core material such as a glass fiber, a glass cloth, a glass fabric, or the like, together with an inorganic filler, for example, a prepreg resin, Ajinomoto Bulid-up Film (ABF) resin, FR-4 resin, Bismaleimide Triazine (BT) resin, or the like, may be used. A photoimageable dielectric (PID) resin may be used as required.

The first and second conductor pattern layers 112a and 112b may serve to redistribute the connection pads 162 of the semiconductor chip 160 and one or more electronic components 120, and in addition, may provide a vertical electrical connection path of the package module 100A. As a material of the first and second conductor pattern layers 112a and 112b, a metal material such as copper (Cu), aluminum (Al), silver (Ag), tin (Sn), gold (Au), nickel (Ni), lead (Pb), titanium (Ti), or alloys thereof may be used. The first and second conductor pattern layers 112a and 112b may perform various functions according to the design of a relevant layer. For example, the first and second conductor pattern layers 112a and 112b may include a ground (GrouND: GND) pattern, a power (PoWeR:PWR) pattern, a signal (Signal: S) pattern, and the like. In this case, the signal S pattern includes various signals except for the ground (GND) pattern, the power (PWR) pattern and the like, for example, may include a data signal and the like. The ground (GND) pattern and the power (PWR) pattern may be formed to have the same pattern. In addition, the first and second conductor pattern layers 112a and 112b may respectively include various via pads and the like.

The conductor via 113 electrically connects the first and second conductor pattern layers 112a and 112b formed on different layers, thereby forming an electrical path in the frame 110. The conductor via 113 may also be formed using a metal material such as copper (Cu), aluminum (Al), silver (Ag), tin (Sn), gold (Au), nickel (Ni), lead (Pb), titanium (Ti) or alloys thereof. The conductor via 113 may be a filled type via fully filled with a metal material, or may be a conformal-type via formed as a metal material is formed along an inner side surface of a via hole. The conductor via 113 may have an hourglass shape, a cylindrical shape, or the like. The conductor via 113 may include a via for a signal, a via for ground and/or power, and the like.

The one or more electronic components 120 are disposed in the respective second penetration hole 110H. The one or more electronic components 120 are disposed side by side with the dummy member 125. The one or more electronic components 120 may respectively be a known passive component such as a capacitor, an inductor, or the like, but an example thereof is not limited thereto. For example, the one or more electronic components 120 may include an integrated circuit (IC) die as required. The one or more electronic components 120 may be electrically connected to the connection pads 162 of the semiconductor chip 160 through the redistribution layer 182 of the connection structure 180. The number of the one or more electronic components 120 is not particularly limited.

The dummy member 125 may be introduced for undulation control and the like. A material of the dummy member 125 is not particularly limited, and may include a material similar to a material of a body 161 of the semiconductor chip 160, such as silicon or the like. The material of the dummy member 125 may include a material similar to that of the insulating layer of the frame 110, for example, a prepreg or the like. The dummy member 125 may be electrically insulated from the connection pad 162 of the semiconductor chip 160 or one or more of the electronic components 120 and the like. The dummy member 125, through which the first penetration hole 150H penetrates, may have a quadrangular ring shape. For example, an inner side surface of the dummy member 125 may form a portion of an inner side surface of the first penetration hole 150H, to continuously surround a side surface of the semiconductor chip 160.

The insulating material 130 is configured to protect the frame 110, the one or more electronic components 120, the dummy member 125, and the like and provide an insulating region. The sealing form thereof is not particularly limited, and may cover at least a portion of each of the frame 110, the one or more electronic components 120 and the dummy members 125 and may fill at least a portion of the second penetration hole 110H. A detailed material of the insulating material 130 is not particularly limited. For example, ABF or Photo Imagable Encapsulant (PIE) may be used.

The wiring member 140 includes an insulating layer 141 disposed on sides of the frame 110 and the electronic component 120, facing the connection structure 180, a wiring layer 142 disposed on the insulating layer 141, and a wiring via 143 electrically connecting the wiring layer 142 and the electronic component 120, while penetrating through the insulating layer 141. The wiring member 140 may include a larger number of insulating layers 141, wiring layers 142 and wiring vias 143, than those illustrated in the drawing.

As a material of the insulating layer 141, an insulating material may be used. In this case, a non-photoimageable dielectric material such as ABF may be used as the insulating material. For example, the insulating layer 141 may be a non-photoimageable dielectric layer. In the case in which the insulating layer 141 is formed of multiple layers, the multiple layers may be integrated depending on a process, and boundaries therebetween may be unclear.

The wiring layer 142 may serve to primarily redistribute the electronic component 120. The wiring layer 142 may be formed using a metal material such as copper (Cu), aluminum (Al), silver (Ag), tin (Sn), gold (Au), nickel (Ni), lead (Pb), titanium (Ti), or alloys thereof. The wiring layer 142 may perform various functions according to the design of a relevant layer. For example, the wiring layer 142 may include a ground (GrouND: GND) pattern, a power (PoWeR: PWR) pattern, a signal (Signal: S) pattern. In this case, the signal S pattern includes various signals except for the ground (GND) pattern, the power (PWR) pattern, and the like, for example, may include a data signal or the like. The ground (GND) pattern and the power (PWR) pattern may also be formed to have the same pattern. In addition, the wiring layer 142 may include various via pads and the like.

The wiring via 143 electrically connects the wiring layer 142, the electronic components 120, the first conductor pattern layer 112a, and the like, formed on different layers, thereby forming an electrical path in the core structure 150. As a material of the wiring via 143, a metal material such as copper (Cu), aluminum (Al), silver (Ag), tin (Sn), gold (Au), nickel (Ni), lead (Pb), titanium (Ti), or alloys thereof may be used. The wiring via 143 may be a filled type via entirely filled with a metal material, or may be a conformal type via formed as a metal material is formed along a wall surface of the via. Further, the wiring via 143 may have a tapered shape. The wiring via 143 may include vias for signals, vias for ground and/or power, and the like.

The first metal layer 115 is disposed on an inner side surface of the second penetration hole 110H to extend to at least one surface of the frame 110, for example, upper and lower surfaces. The first metal layer 115 may completely cover the inner side surface of the second penetration hole 110H, and as a result, may completely surround a side surface of each of the electronic components 120, and thus, may have excellent electromagnetic shielding and heat radiation effect. The first metal layer 115 may include a metal material such as copper (Cu), aluminum (Al), silver (Ag), tin (Sn), gold (Au), nickel (Ni), lead (Pb), titanium (Ti), alloys thereof, or the like. The first metal layer 115 may be electrically connected to the ground pattern of the first conductor pattern layer 112a and/or the second conductor pattern layer 112b and the ground pattern of the wiring layer 142 and/or the redistribution layer 182 to be used as a ground plane.

The semiconductor chip 160 may be a bare integrated circuit (IC) in which hundreds to millions of devices are integrated in a single chip, and may be a packaged integrated circuit (IC) as required. The integrated circuit (IC) may be, for example, a power management integrated circuit (PMIC), a radio frequency integrated circuit (RFIC), or the like, but is not limited thereto. For example, the integrated circuit may be a memory die such as a volatile memory (for example, a dynamic random access memory (DRAM)), a non-volatile memory (for example, a read only memory (ROM)), a flash memory, or the like; an application processor die such as a central processor (for example, a central processing unit (CPU)), a graphics processor (for example, a graphics processing unit (GPU)), a digital signal processor, a cryptographic processor, a microprocessor, a microcontroller, or the like; or a logic die such as an analog-to-digital (ADC) converter, an application-specific integrated circuit (ASIC), or the like.

The semiconductor chip 160 may include a body 161 in which various circuits are formed. The connection pad 162 may be formed on the active surface of the body 161. The body 161 may be formed based on, for example, an active wafer. In this case, as a base material thereof, silicon (Si), germanium (Ge), gallium arsenide (GaAs) or the like may be used. The connection pad 162 is provided to electrically connect the semiconductor chip 160 to other components. The connection pad 162 may be formed using a metal material, in detail, copper (Cu) or aluminum (Al), but a material thereof is not limited thereto. In the case of the semiconductor chip 160, a surface on which the connection pad 162 is disposed is an active surface and a surface opposed thereto is an inactive surface. A passivation film 163 composed of an oxide film and/or a nitride film having a groove exposing at least a portion of the connection pad 162 may be formed on the active surface of the semiconductor chip 160. In this case, the determination of the positional relationship with other components of the active surface is based on the passivation film 163.

The encapsulant 170 protects the core structure 150 and the semiconductor chip 160 and provides an insulating region. The sealing form thereof is not particularly limited, and may cover at least a portion of the core structure 150 and the semiconductor chip 160, and may also fill at least a portion of the second penetration hole 110H. A detailed material of the encapsulant 170 is not particularly limited. For example, ABF or PIE may be used, but the material of the encapsulant 170 is not limited thereto.

The backside metal layer 172A effectively blocks electromagnetic waves to the back side of the semiconductor chip 160 and the one or more electronic components 120, and as a result, may effectively isolate different types of blocks. In addition, the backside metal layer 172A may also improve an effect of heat dissipation of the semiconductor chip 160 and the one or more electronic components 120 to the back side thereof. To this end, the backside metal layer 172A may be disposed in the form of a plate to cover the inactive surface of the semiconductor chip 160 on the encapsulant 170 and the region directly above each of the one or more electronic components 120. For example, the backside metal layer 172A may be formed to have the form of a single plate, and may also be in the form of a plurality of plates, as required. As a material for forming the backside metal layer 172A, a metal material such as copper (Cu), aluminum (Al), silver (Ag), tin (Sn), gold (Au), nickel (Ni), lead (Pb), titanium (Ti), or alloys thereof may be used. The backside metal layer 172A may be electrically connected to the ground pattern of the first conductor pattern layer 112a and/or the second conductor pattern layer 112b and the ground pattern of the wiring layer 142 and/or the redistribution layer 182, and thus, may also be used as a ground plane.

The first and second metal vias 173Aa and 173Ab connect the backside metal layer 172A to the first metal layer 115 and the second metal layer 155, respectively, thereby further improve shielding of electromagnetic waves to the backside of the semiconductor chip 160 and the one or more electronic components 120, and as a result, isolating the different types of blocks more effectively. The first and second metal vias 173Aa and 173Ab may also be formed using a metal material such as copper (Cu), aluminum (Al), silver (Ag), tin (Sn), gold (Au), nickel (Ni), lead (Pb), titanium (Ti), or alloys thereof. The first and second metal vias 173Aa and 173Ab may each be a filled type via entirely filled with a metal material or may also be a conformal type via formed as the metal material is formed only along walls of the vias. Further, the first and second metal vias 173Aa and 173Ab may have a tapered shape in a direction opposite to that of the wiring via 143. The first and second metal vias 173Aa and 173Ab may also be electrically connected to a ground pattern of the first conductor pattern layer 112a and/or the second conductor pattern layer 112b and a ground pattern of the wiring layer 142 and/or the redistribution layer 182 to be used as a ground plane. The first metal via 173Aa may have a height greater than that of the second metal via 173Ab.

The backside conductor pattern layer 172B may be electrically connected to the first and second conductor pattern layers 112a and 112b of the frame 110, and may also provide pads for electrical connection in electrical connection metals, and thus, may provide a connection path of signals when the package module 100A is mounted on a main board or the like. The backside conductor pattern layer 172B may also redistribute the connection pads 162 of the semiconductor chip 160 and the one or more electronic components 120. As a material of the backside conductor pattern layer 172B, a metal material such as copper (Cu), aluminum (Al), silver (Ag), tin (Sn), gold (Au), nickel (Ni), lead (Pb), titanium (Ti), or alloys thereof may be used. The backside conductor pattern layer 172B may perform various functions according to the design. For example, the backside conductor pattern layer 172B may include a signal pattern and the like, and further, may include via pads, electrical connection metal pads, and the like.

The backside conductor via 173B electrically connects the backside conductor pattern layer 172B and the second conductor pattern layer 112b formed in different layers. The backside conductor via 173B may also be formed using a metal material such as copper (Cu), aluminum (Al), silver (Ag), tin (Sn), gold (Au), nickel (Ni), lead (Pb), titanium (Ti), or alloys thereof. The backside conductor via 173B may also be filled type via entirely filled with a metal material, or may be a conformal type via formed as the metal material is formed only along a wall of the via. Further, the backside conductor via 173B may have a tapered shape formed in a direction opposite to that of the wiring via 143, and may also be used as a via for signal connection.

The connection structure 180 may redistribute the connection pads 162 of the semiconductor chip 160. In addition, the connection structure 180 may electrically connect the connection pad 162 of the semiconductor chip 160 to the one or more electronic components 120. The connection pads 162 of tens to millions of semiconductor chips 160 having various functions may be respectively redistributed through the connection structure 180. The connection structure 180 includes an insulating layer 181 disposed on the core structure 150 and the active surface of the semiconductor chip 160, the redistribution layer 182 disposed on the insulating layer 181, and the connection via 183 penetrating through the insulating layer 181 and connected to the redistribution layer 182. The connection structure 180 may be designed with a relatively greater number or fewer number of layers than those illustrated in the drawings.

As a material of the insulating layer 181, an insulating material may be used. In addition to the above-described insulating material, a photoimageable dielectric material such as a PID resin may be used as the insulating material. For example, the insulating layer 181 may be a photoimageable dielectric layer. For example, when the insulating layer 181 has photoimageable properties, the insulating layer 181 may be formed to have a relatively reduced thickness, and a fine pitch of the connection via 183 may be more easily implemented. The insulating layer 181 may be a photoimageable dielectric layer containing an insulating resin and an inorganic filler. For example, when the insulating layer 181 is composed of multiple layers, the material of the multiple layers may be the same material, and may be different materials as needed. In the case in which the insulating layer 181 is provided as multiple layers, the layers may be integrated according to the process, and the boundaries therebetween may be unclear.

The redistribution layer 182 may serve to substantially redistribute the connection pads 162 of the semiconductor chip 160 and electrodes of the one or more electronic components 120. As a material of the redistribution layer 182, a metal material such as copper (Cu), aluminum (Al), silver (Ag), tin (Sn), gold (Au), nickel (Ni), lead (Pb), titanium (Ti), or alloys thereof may be used. The redistribution layer 182 may perform various functions according to the design of the layer. For example, the redistribution layer 182 may include a ground (GrouND: GND) pattern, a power (PoWeR: PWR) pattern, a signal (Signal: S) pattern and the like. In this case, the signal S pattern includes various signals except for a ground (GND) pattern, a power (PWR) pattern, and the like, for example, may include a data signal and the like. The ground (GND) pattern and the power (PWR) pattern may be formed to have the same pattern. In addition, the redistribution layer 182 may include various via pads, connection terminal pads, and the like.

The connection via 183 electrically connects the redistribution layer 182, the connection pad 162 and one wiring layer 142, formed in different layers, to each other and as a result, forms an electrical path in the package module 100A. The connection via 183 may be formed using a metal material such as copper (Cu), aluminum (Al), silver (Ag), tin (Sn), gold (Au), nickel (Ni), lead (Pb), titanium (Ti), or alloys thereof. The connection via 183 may be a filled type via entirely filled with a metal material or may be a conformal type via formed as a metal material is formed along the wall of the via. Further, the connection via 183 may have a tapered shape formed in the same direction as that of the wiring via 143. The connection via 183 may include vias for signals, vias for ground, and/or power and the like.

The first passivation layer 191 may protect the redistribution layer 182 of the connection structure 180 from external physical chemical damage or the like. The first passivation layer 191 includes an insulating resin and an inorganic filler, but may not include glass fiber. For example, the first passivation layer 191 may be ABF, but is not limited thereto, and may be a PID, a solder resist (SR), or the like. The first passivation layer 191 may have a plurality of openings respectively exposing at least a portion of the redistribution layer 182 of the connection structure 180. Nickel (Ni)/gold (Au) plating or the like may be applied to an exposed surface of the redistribution layer 182.

The second passivation layer 192 may protect the backside metal layer 172A and the backside conductor pattern layer 172B from external physical chemical damage or the like. The second passivation layer 192 may include, but is not limited to, an insulating resin and an inorganic filler, but does not include glass fibers, for example, may be formed of ABF. The second passivation layer 192 may have a plurality of openings that respectively expose at least a portion of each of the backside metal layers 172A and the backside conductor pattern layer 172B. The exposed surfaces of the backside metal layer 172A and the backside conductor pattern layer 172B may be plated with nickel (Ni)/gold (Au) or the like.

The first and second electrical connection metals 194 and 195 may physically and/or electrically connect the package module 100C externally. For example, the package module 100A may be connected to another package or a printed circuit board through the first and second electrical connection metals 194 and 195. The printed circuit board may be a mainboard of an electronic device. The first and second electrical connection metals 194 and 195 may be formed of a low melting point metal, for example, a material including tin (Sn), in more detail, solder or the like by way of example, but the material thereof is not particularly limited. The first and second electrical connection metals 194 and 195 may be a land, a ball, a pin, or the like. The first and second electrical connection metals 194 and 195 may be respectively formed of multiple layers or a single layer. In the case of the multiple layers, the first and second electrical connection metals 194 and 195 may include a copper pillar and a solder. In the case of the single layer, the first and second electrical connection metals 194 and 195 may include solder or copper, but an example thereof is not limited thereto. The number, spacing, arrangement type, and the like of the first and second electrical connection metals 194 and 195 are not particularly limited, and may be sufficiently modified according to design specifications for those skilled in the art.

In the case of each of the first and second electrical connection metals 194 and 195, at least one thereof is disposed in a fan-out region. The fan-out region means an area outside the area in which the semiconductor chip 160 is disposed. The fan-out package is more reliable than the fan-in package, allows for implementation of multiple I/O terminals, and facilitates 3D interconnection. Compared with a Ball Grid Array (BGA) package and a Land Grid Array (LGA) package, the fan-out package may allow package thickness to be relatively thinner and excellent price competitiveness. For example, the package module 100A may be the fan-out package module 100A.

FIGS. 11 to 14 are process diagrams schematically illustrating an example of manufacturing the package module of FIG. 9.

Figure 11:
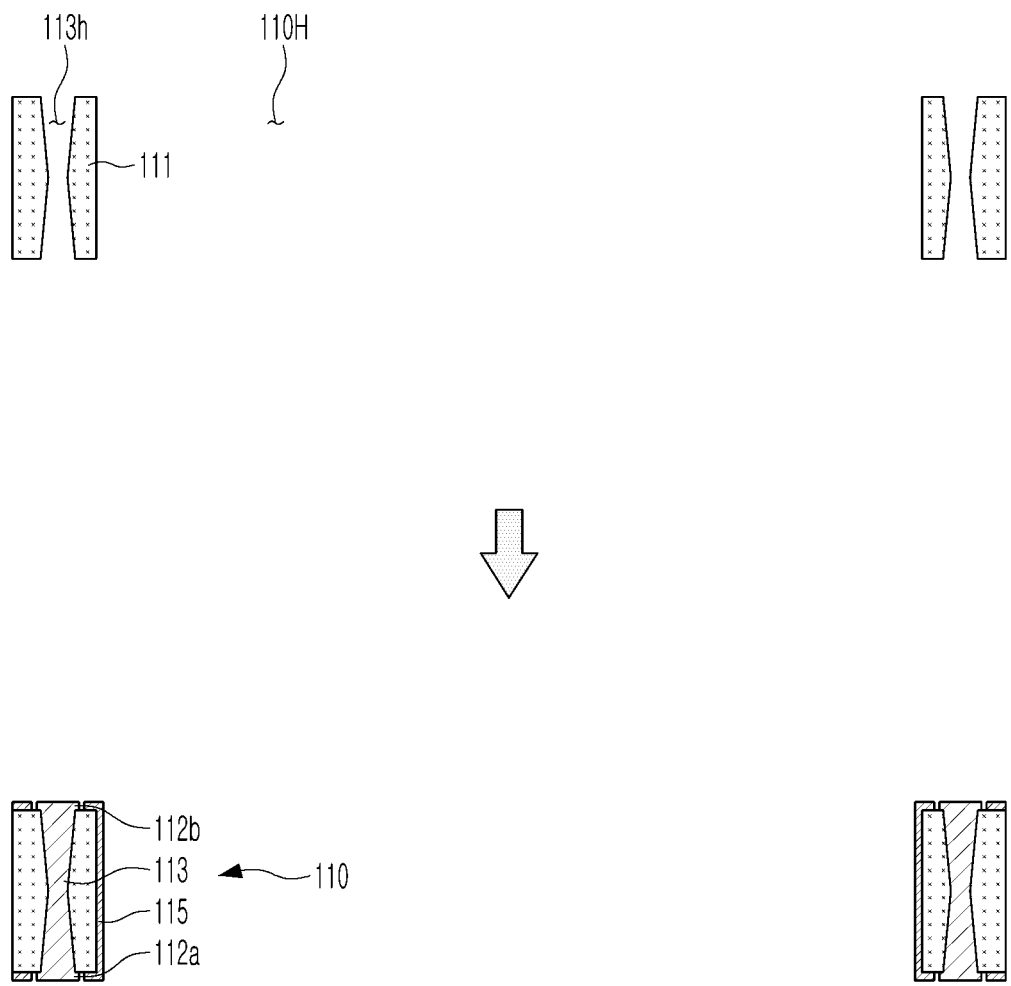
FIGS. 11 to 14 are process diagrams schematically illustrating an example of manufacturing the package module of FIG. 9.

Referring to FIG. 11, first, an insulating layer 111 is prepared through a copper clad laminate (CCL) or the like. Thereafter, a through hole 113h and a second penetration hole 110H are formed in the insulating layer 111 using laser drilling or the like. Next, first and second conductor pattern layers 112a and 112b, conductor vias 113, and a first metal layer 115 are formed on inner side surfaces of the insulating layer 111, the through hole 113h and the second penetration hole 110H, using a known plating process, such as an additive process (AP), a semi-additive process (SAP), a modified semi-additive process (MSAP), or a tenting process or the like. In a series of processes, a frame 110 is formed.

Referring to FIG. 12, one or more electronic components 120 and a dummy member 125 are disposed in the second penetration hole 110H, using a tape (not illustrated) or the like, and the frame 110, the one or more electronic components 120, and the dummy member 125 are sealed with an insulating material 130, using ABF or the like. The problem of undulation of the insulating material 130 as described above may be prevented by the dummy member 125. Next, an insulating layer 141 is formed on an approximately flat surface with almost no undulation using ABF or the like, and a via hole 143h penetrating through the insulating layer 141, and a first penetration hole 150H penetrating through all of the insulating material 130, the dummy member 125 and the insulating layer 125, are formed using laser drilling or the like.

Subsequently, referring to FIG. 13, the wiring layer 142, the wiring via 143 and the second metal layer 155 are formed on inner side surfaces of the insulating layer 141, the via hole 143h, and the first penetration hole 150H by the above-described plating process such as AP, SAP, MSAP, tenting, or the like. The wiring member 140 is formed through a series of processes, and as a result, the core structure 150 is formed. Next, a semiconductor chip 160 is disposed in the first penetration hole 150H using a tape (not illustrated) or the like, and the core structure 150 and the semiconductor chip 160 are encapsulated with the encapsulant 170.

Figure 14:
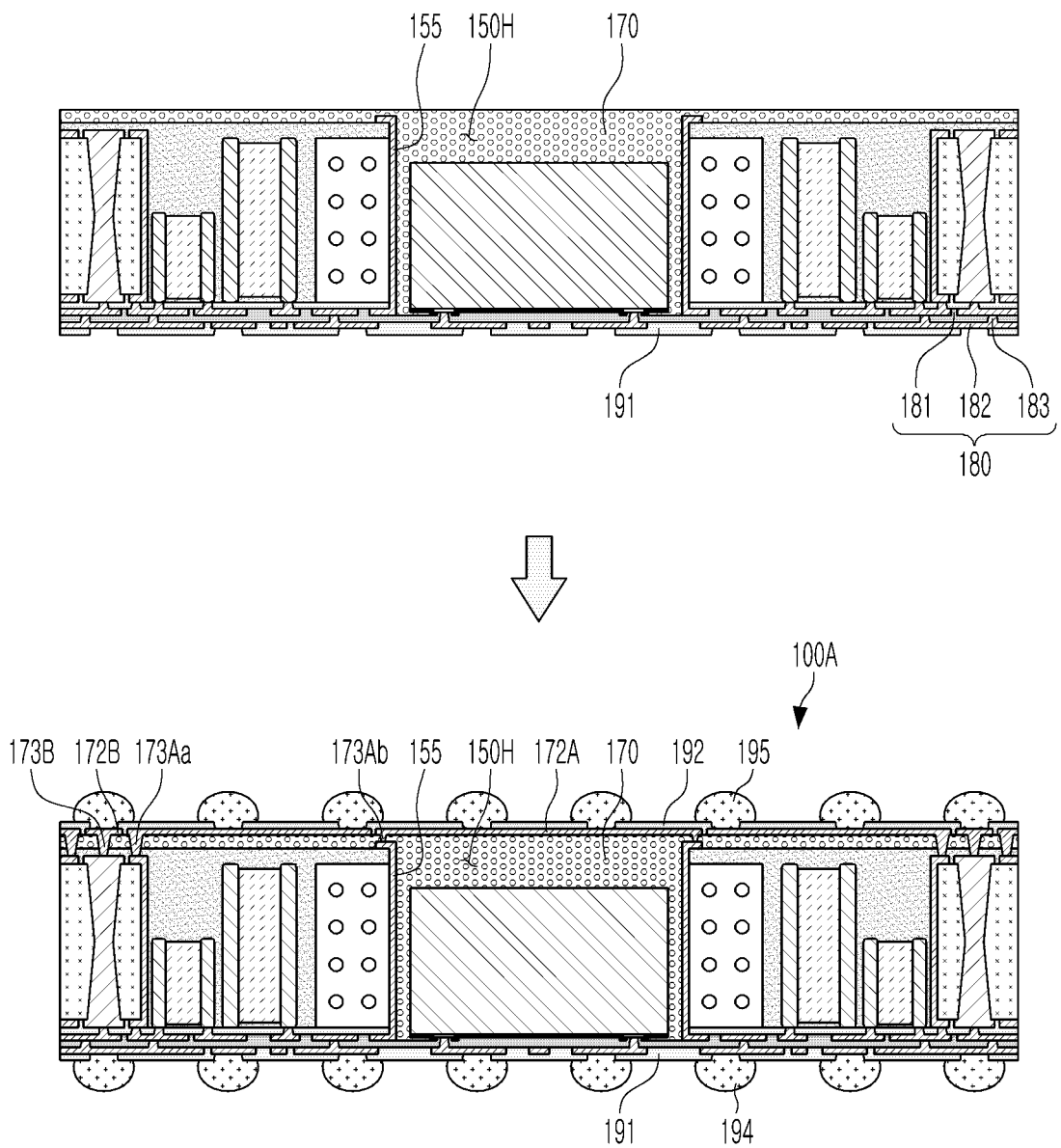

Referring to FIG. 14, next, an insulating layer 181 is formed on the core structure 150 and the active surface of the semiconductor chip 160 by PID coating and curing, a photo via hole is formed by a photolithography process, and then, a redistribution layer 182 and a connection via 183 are formed on the insulating layer 181 and in the via hole by the above-described plating process such as AP, SAP, MSAP, tenting or the like. The series of processes are repeated as necessary to form a connection structure 180. Next, a backside metal layer 172A, a backside conductor pattern layer 172B, first and second metal vias 173Aa and 173Ab, and a backside conductor via 173B are formed by the above-described plating process or the like, and in addition, first and second passivation layers 191 and 192 are formed by ABF lamination or the like, and first and second electrical connection metals 194 and 195 are formed by solder or the like, thereby forming the package module 100A according to an example.

On the other hand, the above-described series of processes may be performed at a panel level, starting from a large-sized copper clad laminate (CCL) or the like. In this case, a plurality of package modules 100A may be manufactured using a singulation process, thereby increasing productivity. For example, the package module 100A according to an example may be a panel level package (PLP) module.

The detailed description of other configurations is substantially the same as the description above with reference to FIGS. 9 and 10, and thus, a detailed description thereof will be omitted.

Figure 15:
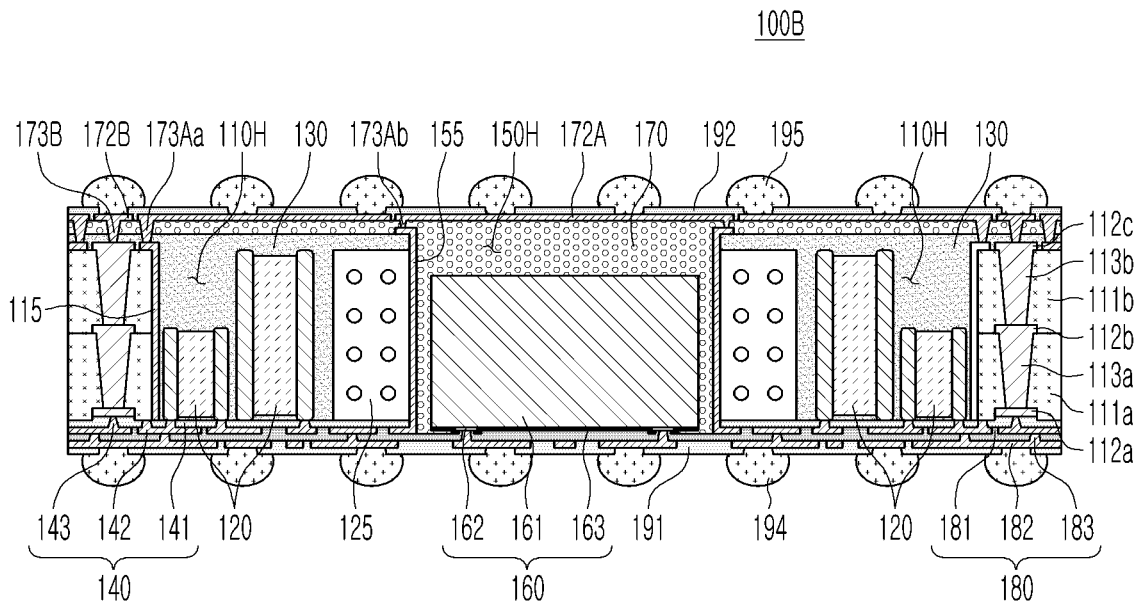
FIG. 15 is a cross-sectional view schematically illustrating another example of the package module.

FIG. 15 is a cross-sectional view schematically illustrating another example of a package module.

Referring to FIG. 15, in the case of a package module 100B according to another example, a frame 110 of a core structure 150 includes a first insulating layer 111a, a first conductor pattern layer 112a embedded in the first insulating layer 111a in such a manner that one surface thereof is exposed, a second conductor pattern layer 112b disposed on an opposite side of a side of the first insulating layer 111a in which the first conductor pattern layer 112a is embedded, a second insulating layer 111b disposed on the opposite side of the side of the first insulating layer 111a in which the first conductor pattern layer 112a is embedded, and covering the second conductor pattern layer 112b, and a third conductor pattern layer 112c disposed on an opposite side of a side of the second insulating layer 111b in which the second conductor pattern layer 112b is embedded. The first to third conductor pattern layers 112a, 112b and 112c may be electrically connected to connection pads 162 and the electronic components 120. The first and second conductor pattern layers 112a and 112b and the second and third conductor pattern layers 112b and 112c are connected, through first and second conductor vias 113a and 113b, penetrating through the first and second insulating layers 111a and 111b, respectively. As such, in the case in which the frame 110 includes a relatively greater number of conductor pattern layers 112a, 112b and 112c, the design of the connection structure 180 may be further simplified, and thus, a problem related to a yield of the semiconductor chip 160 occurring in a process of forming the connection structure 180 may be reduced.

The material of the first and second insulating layers 111a and 111b is not particularly limited. For example, an insulating material may be used. As the insulating material, a thermosetting resin such as an epoxy resin, a thermoplastic resin such as polyimide, or a mixture of these resins with an inorganic filler, or a mixture of these resins with an inorganic filler, or a resin impregnated with a core material such as a glass fiber or the like together with an inorganic filler, for example, a prepreg resin, Ajinomoto Bulid-up Film (ABF) resin, FR-4 resin, Bismaleimide Triazine (BT) resin, or the like, may be used.

The first to third conductor pattern layers 112a to 112c may serve to redistribute the connection pads 162 of the semiconductor chip 160 and electrodes of the electronic components 120, and may allow the frame 110 to perform a function of an electrical connection member. The first to third conductor pattern layers 112a, 112b and 112c may be formed using a metal material, such as copper (Cu), aluminum (Al), silver (Ag), tin (Sn), gold (Au), nickel (Ni), lead (Pb), titanium (Ti), or alloys thereof. The first to third conductor pattern layers 112a, 112b and 112c may perform various functions according to the design of a relevant layer. For example, the first to third conductor pattern layers 112a, 112b and 112c may include aground (GrouND: GND) pattern, a power (PoWeR: PWR) pattern, a signal (Signal: S) pattern, and the like. The ground (GND) pattern and the power (PWR) pattern may be formed to have the same pattern. The signal S pattern includes various signals except for the ground (GND) pattern, the power (PWR) pattern and the like, for example, may include a data signal and the like, and in addition, may include a signal via pad, a ground via pad or the like.

In the case in which the first conductor pattern layer 112a is embedded in the first insulating layer 111a, a step generated by the thickness of the first conductor pattern layer 112a may be significantly reduced, and thus, an insulation distance of the connection structure 180 may be constant. For example, a difference between a distance from the redistribution layer 182 of the connection structure 180 to one surface of the first insulating layer 111a and a distance from the redistribution layer 182 of the connection structure 180 to one surface of the connection pad 162 may be less than a thickness of the first conductor pattern layer 112a. Therefore, a high-density wiring design of the connection structure 180 may be facilitated.

The first conductor pattern layer 112a may be recessed into the first insulating layer 111a. As described above, for example, when the first conductor pattern layer 112a is recessed into the first insulating layer 111a and thus one surface of the first insulating layer 111a and one surface of the first conductor pattern layer 112a have a step, a material of the encapsulant 170 may be prevented from bleeding and contaminating the first conductor pattern layer 112a. The second conductor pattern layer 112b of the frame 110 may be positioned between an active surface and an inactive surface of the semiconductor chip 160. The frame 110 may be formed to have a considerable thickness, such that the second conductor pattern layer 112b formed inside the frame 110 may be disposed on a level between the active surface and the inactive surface of the semiconductor chip 160.

A thickness of each of the first to third conductor pattern layers 112a, 112b and 112c may be greater than a thickness of the redistribution layer 182. Since the frame 110 may have a considerable thickness, the first to third conductor pattern layers 112a, 112b and 112c may also be formed to have a relatively large size corresponding to the scale. On the other hand, the redistribution layer 182 may be formed to have a relatively small size for designing of a microcircuit.

The first and second conductor vias 113a and 113b electrically connect the first to third conductor pattern layers 112a, 112b and 112c formed on different layers, to form an electrical path in the frame 110. The first and second conductor vias 113a and 113b may also be formed using a metal material. The first and second conductor vias 113a and 113b may be filled type vias fully filled with a metal material, or may be conformal-type vias in which a metal material is formed along an inner side surface of a via hole, and in addition, may have a tapered shape in the same direction. Further, a portion of pads of the first conductor pattern layer 112a may serve as a stopper when a hole for the first conductor via 113a is formed. Thus, the first conductor via 113a may have a tapered shape in which a width of a lower surface is smaller than a width of an upper surface, which may be advantages in terms of a process. In this case, the first conductor via 113a may be integrated with a pad pattern of the second conductor pattern layer 112b. In addition, when forming a hole for the second conductor via 113b, a portion of pads of the second conductor pattern layer 112b may serve as a stopper, and thus, the second conductor via 113b may have a tapered shape in which a width of a lower surface is smaller than a width of an upper surface, which may be advantages in terms of a process. In this case, the second conductor via 113b may be integrated with a pad pattern of the third conductor pattern layer 112c.

Other details are substantially the same as those described above with reference to FIGS. 9 to 14, and thus, a detailed description thereof will be omitted.

Figure 16:
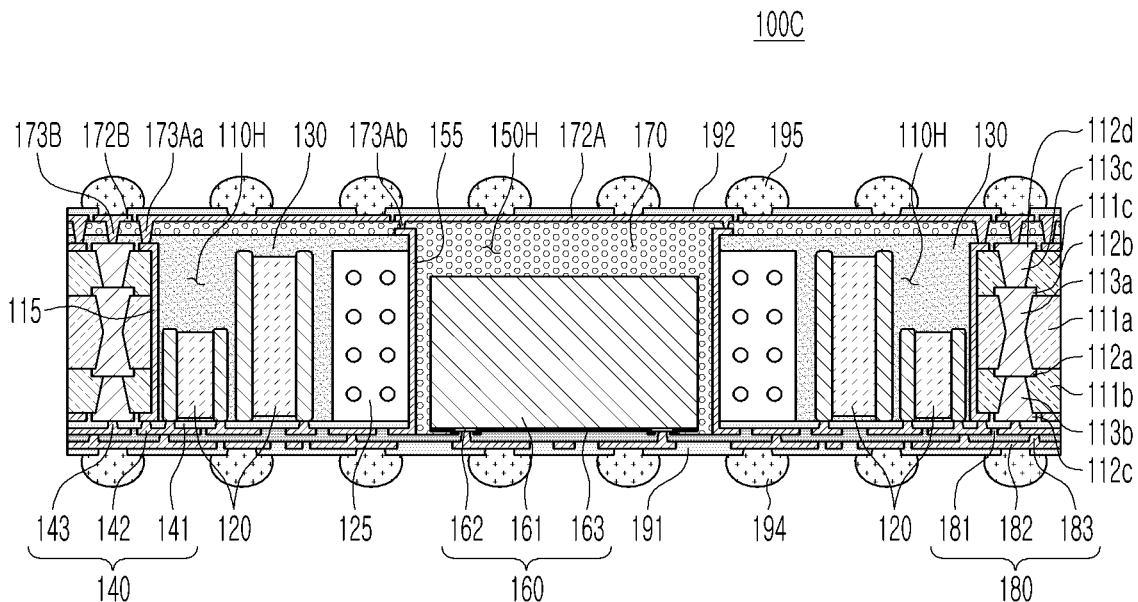
FIG. 16 is a cross-sectional view schematically illustrating another example of the package module.

FIG. 16 is a cross-sectional view schematically illustrating another example of a package module.

Referring to FIG. 16, in the case of a package module 100C according to another example, a frame 110 of a core structure 150 includes a first insulating layer 111a, a first conductor pattern layer 112a and a second conductor pattern layer 112b disposed on both surfaces of the first insulating layer 111a, a second insulating layer 111b and a third insulating layer 111c disposed on both surfaces of the first insulating layer 111a to cover the first conductor pattern layer 112a and the second conductor pattern layer 112b, respectively, a third conductor pattern layer 112c disposed on an opposite side of a side of the second insulating layer 111b in which the first conductor pattern layer 112a is embedded, and a fourth conductor pattern layer 112d disposed on an opposite side of a side of the third insulating layer 111c in which the second conductor pattern layer 112b is embedded. The first and second conductor pattern layers 112a and 112b and the third and fourth conductor pattern layers 112c and 112d may be electrically connected to the connection pads 162 and the electronic components 120. Since the frame 110 includes a relatively greater number of conductor pattern layers 112a, 112b, 112c and 112d, the connection structure 180 may be further simplified. The first and second conductor pattern layers 112a and 112b and the third and fourth conductor pattern layers 112c and 112d may be electrically connected, through first to third conductor vias 113a, 113b and 113c passing through the first to third insulating layers 111a, 111b and 111c, respectively.

The first insulating layer 111a may have a thickness greater than that of the second insulating layer 111b and the third insulating layer 111c. The first insulating layer 111a may be relatively thick to maintain rigidity, and the second insulating layer 111b and the third insulating layer 111c may be used for formation of a relatively larger number of third and fourth conductor pattern layers 112c and 112d. Similarly, the first conductor via 113a passing through the first insulating layer 111a may have an average diameter greater than that of the second and third conductor vias 113b and 113c passing through the second and third insulating layers 111b and 111c. The first conductor via 113a may have a cylindrical shape or an hourglass shape. The second and third conductor vias 113b and 113c may have a tapered shape in directions opposite to each other. A thickness of each of the first to fourth conductor pattern layers 112a, 112b, 112c and 112d may be greater than a thickness of each of the redistribution layers 182.

Other details are substantially the same as those described above with reference to FIGS. 9 to 15, and a detailed description thereof will be omitted.

As set forth above, according to an example in the present disclosure, a package module in which thinning and miniaturization may be implemented, even when a plurality of chips and electronic components are included, the degree of integration may be increased, and a problem such as undulation or resin bleeding may be prevented may be provided. The expression, 'coplanar' or 'on the same level', in the present disclosure is meant to include not only being located at exactly the same level but also located at approximately the same level as a result of a grinding process or the like, for example, including a case in which a minute error occurs in the process progress.

The expression, an example, used in this disclosure does not mean the same embodiment, but is provided for emphasizing and explaining different unique features. However, the above-mentioned examples do not exclude being implemented in combination with the features of other examples. For example, although the description in the specific example is not described in another example, it may be understood as an explanation related to another example, unless otherwise described or contradicted by the other example.

The meaning of being connected in the present disclosure encompasses not only a direct connection, but also includes an indirect connection. In addition, the term "electrically connected" means a concept including both a physical connection and non-connection. Further, the first and second expressions are used to distinguish one component from another component and do not limit the order and/or importance of components and the like. In some cases, without departing from the scope of the rights, a first component may be referred to as a second component, and similarly, a second component may also be referred to as a first component.

In the present disclosure, an upper portion, a lower portion, an upper side, a lower side, an upper surface, a lower surface, and the like are determined based on the attached drawings. For example, the connection member is located above the redistribution layer. However, the claims are not limited thereto. In addition, the vertical direction means the above-mentioned upper and lower directions, and the horizontal direction means the direction perpendicular thereto. In this case, the vertical cross-section means a case of cutting into a plane in the vertical direction, and the cross-sectional view shown in the drawings is an example. In addition, the horizontal cross-section means a case of cutting into a plane in the horizontal direction, for example, the plan view shown in the drawing.

What is claimed is:

1. A package module comprising:
a core structure including a dummy member, one or more electronic components disposed around the dummy member, and an insulating material covering at least a portion of each of the dummy member and the one or more electronic components, the core structure including a first penetration hole passing through the dummy member and the insulating material;
a semiconductor chip disposed in the first penetration hole, and having an active surface on which a connection pad is disposed and an inactive surface opposing the active surface;
an encapsulant covering at least a portion of each of the core structure and the semiconductor chip, the encapsulant being disposed in at least a portion of the first penetration hole; and
a connection structure disposed on the core structure and the active surface of the semiconductor chip, and including a redistribution layer electrically connected to the one or more electronic components and the connection pad.

2. The package module of claim 1, wherein the core structure further comprises a frame having a second penetration hole; and
the dummy member and the one or more electronic components are arranged in parallel to each other in the second penetration hole, and the insulating material covers at least a portion of the frame and is disposed in at least a portion of the second penetration hole.

3. The package module of claim 2, wherein the first penetration hole is located inside the second penetration hole.

4. The package module of claim 3, wherein the core structure further comprises a first metal layer disposed on an inner side surface of the second penetration hole and a second metal layer disposed on an inner side surface of the first penetration hole.

5. The package module of claim 4, wherein the first and second metal layers respectively extend onto at least one surface of the frame and at least one surface of the insulating material,
wherein a backside metal layer is disposed on a surface of the encapsulant opposite to a surface of the encapsulant on which the connection structure is disposed, and
wherein the backside metal layer is connected to the first metal layer through a first metal via penetrating through the encapsulant and the insulating material, and is connected to the second metal layer through a second metal via penetrating through the encapsulant.

6. The package module of claim 5, wherein a height of the first metal via is greater than a height of the second metal via.

7. The package module of claim 2, wherein the frame further comprises a plurality of conductor pattern layers electrically connected to each other, and
wherein the plurality of conductor pattern layers are electrically connected to the redistribution layer.

8. The package module of claim 7, wherein a backside conductor pattern layer is disposed on a surface of the encapsulant opposite to a surface of the encapsulant on which the connection structure is disposed, and the backside conductor pattern layer is electrically connected to the plurality of conductor pattern layers through a backside conductor via passing through the encapsulant and the insulating material.

9. The package module of claim 7, wherein the frame comprises:
a first insulating layer;
a first conductor pattern layer embedded in the first insulating layer in such a manner that one surface of the first conductor pattern layer is exposed;
a second conductor pattern layer disposed on an opposite side of a side of the first insulating layer in which the first conductor pattern layer is embedded;
a second insulating layer disposed on the opposite side of the side of the first insulating layer in which the first conductor pattern layer is embedded, the second insulating layer covering the second conductor pattern layer; and
a third conductor pattern layer disposed on an opposite side of aside of the second insulating layer in which the second conductor pattern layer is embedded, and
the plurality of conductor pattern layers comprise the first to third conductor pattern layers.

10. The package module of claim 7, wherein the frame comprises:
a first insulating layer;
first and second conductor pattern layers disposed on both surfaces of the first insulating layer, respectively;
second and third insulating layers disposed on both surfaces of the first insulating layer to cover the first and second conductor pattern layers, respectively;
a third conductor pattern layer disposed on an opposite side of a side of the second insulating layer in which the first conductor pattern layer is embedded; and
a fourth conductor pattern layer disposed on an opposite side of a side of the third insulating layer in which the second conductor pattern layer is embedded, and
the plurality of conductor pattern layers comprise the first to fourth conductor pattern layers.

11. The package module of claim 1, wherein the core structure further comprises a wiring member arranged between the one or more electronic components and the connection structure, and including a wiring layer electrically connected to the one or more electronic components.

12. The package module of claim 11, wherein the active surface of the semiconductor chip is located on a level lower than a surface of the one or more electronic components in contact with the wiring member in a stacking direction, such that the surface of the one or more electronic components in contact with the wiring member is closer to the inactive surface of the semiconductor chip than the active surface of the semiconductor chip.

13. The package module of claim 11, wherein the one or more electronic components comprise at least one of a capacitor or an inductor.

14. The package module of claim 1, wherein the dummy member is electrically insulated from the one or more electronic components and the connection pad, respectively.

15. The package module of claim 1, wherein an inner side surface of the dummy member includes a portion of an inner side surface of the first penetration hole,
wherein the inner side surface of the dummy member continuously surrounds an outer surface of the semiconductor chip.

16. The package module of claim 1, wherein one surface of the dummy member facing the connection structure is coplanar with one surface of the one or more electronic components facing the connection structure.

17. The package module of claim 1, wherein a lower surface of the dummy member, which is closer to the connection structure, and the active surface of the semiconductor chip are located in different levels of height in a stacking direction.

18. The package module of claim 1, wherein the dummy member and the semiconductor chip are spaced apart from each other, and
at least a portion of the encapsulant is disposed in a space between the dummy member and the semiconductor chip.

\* \* \* \* \*